(12) United States Patent
Zhang et al.

(10) Patent No.: US 12,386,004 B2
(45) Date of Patent: Aug. 12, 2025

(54) METHODS AND SYSTEMS FOR MOTION DETECTION IN MAGNETIC RESONANCE IMAGING

(71) Applicant: SHANGHAI UNITED IMAGING HEALTHCARE CO., LTD., Shanghai (CN)

(72) Inventors: Xinzhen Zhang, Shanghai (CN); Xuan Wang, Shanghai (CN); Jiansen Li, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 77 days.

(21) Appl. No.: 18/313,334

(22) Filed: May 6, 2023

(65) Prior Publication Data
US 2023/0358837 A1 Nov. 9, 2023

(30) Foreign Application Priority Data

May 6, 2022 (CN) .......................... 202210483930.1
Aug. 9, 2022 (CN) .......................... 202210951455.6

(51) Int. Cl.
*G01V 3/00* (2006.01)
*G01R 33/565* (2006.01)

(52) U.S. Cl.
CPC .............................. *G01R 33/56509* (2013.01)

(58) Field of Classification Search
CPC .............................................. G01R 33/56509
USPC ...................................................... 324/309
See application file for complete search history.

(56) References Cited

U.S. PATENT DOCUMENTS

| 2006/0176055 | A1* | 8/2006 | Fukuta | ............. G01R 33/56554 |
| | | | | 324/307 |
| 2017/0038449 | A1 | 2/2017 | Voigt et al. | |
| 2017/0108571 | A1 | 4/2017 | Jurrissen et al. | |
| 2018/0306882 | A1* | 10/2018 | Li | .......................... A61B 5/055 |
| 2022/0011393 | A1 | 1/2022 | Strauss et al. | |

(Continued)

FOREIGN PATENT DOCUMENTS

| CN | 106056589 | A | * | 10/2016 | ........... A61B 8/5223 |
| CN | 106919895 | A | * | 7/2017 | ......... G06K 9/00771 |
| CN | 110031786 | A | * | 7/2019 | ......... G01R 33/4818 |

(Continued)

OTHER PUBLICATIONS

DE 3736923 A1 (Kasugai) (Year: 1988).*

(Continued)

*Primary Examiner* — Walter L Lindsay, Jr.
*Assistant Examiner* — Frederick Wenderoth
(74) *Attorney, Agent, or Firm* — METIS IP LLC

(57) ABSTRACT

The present disclosure provides methods, and systems for motion detection in magnetic resonance imaging. The method may include obtaining auxiliary magnetic resonance data of a target object by scanning the target object using an auxiliary sequence inserted in at least two imaging sub-sequences in a magnetic resonance imaging process of the target object, wherein the auxiliary sequence includes a plurality of auxiliary sub-sequences inserted at different positions in the at least two imaging sub-sequences; and determining, based on the auxiliary magnetic resonance data, motion state information of a region of interest of the target object.

19 Claims, 21 Drawing Sheets

(56) References Cited

U.S. PATENT DOCUMENTS

2022/0047227 A1  2/2022  Heukensfeldt Jansen

FOREIGN PATENT DOCUMENTS

| CN | 106725508 B | 9/2021 | |
|---|---|---|---|
| CN | 110716165 B | 12/2021 | |
| EP | 2902960 A1 * | 8/2015 | ........... G01B 11/026 |
| JP | 2003144410 A * | 5/2003 | |
| WO | WO-2013025487 A1 * | 2/2013 | ....... G01R 33/56341 |
| WO | 2017001208 A1 | 1/2017 | |

OTHER PUBLICATIONS

Li, Guobin et al., Improving the Robustness of 3D Turbo Spin Echo Imaging to Involuntary Motion, Magnetic Resonance Materials in Physics, 2014, 17 pages.
First Office Action in Chinese Application No. 202210463930.1 mailed on Jun. 27, 2025, 18 pages.

* cited by examiner

300

┌─────────────────────────────────────────────┐
│ Obtaining auxiliary magnetic resonance data of a │ ─── 310
│ target object by scanning the target object using an │
│ auxiliary sequence inserted in at least two imaging │
│ sub-sequences in a magnetic resonance imaging │
│ process of the target object │
└─────────────────────────────────────────────┘
                    ↓
┌─────────────────────────────────────────────┐
│ Determining, based on the auxiliary magnetic │ ─── 320
│ resonance data, motion state information of a region of │
│ interest of the target object │
└─────────────────────────────────────────────┘
                    ↓
┌─────────────────────────────────────────────┐
│ Obtaining magnetic resonance imaging data of the │
│ region of interest of the target object by controlling, │ ─── 330
│ based on the motion state information of the region of │
│ interest, an imaging scan related to the at least two │
│ imaging sub-sequences performed on the target │
│ object │
└─────────────────────────────────────────────┘

610 — Obtaining, in the auxiliary magnetic resonance data, first data related to a first direction of the region of interest and second data related to a second direction of the region of interest

620 — Determining the motion state information of the region of interest according to the first data and the second data

FIG. 6

METHODS AND SYSTEMS FOR MOTION DETECTION IN MAGNETIC RESONANCE IMAGING

CROSS-REFERENCE TO RELATED APPLICATIONS

This application claims priority to Chinese Patent Application No. 202210483930.1, filed on May 6, 2022, and Chinese Patent Application No. 202210951455.6, filed on Aug. 9, 2022, the entire contents of each of which are hereby incorporated herein by reference.

TECHNICAL FIELD

The present disclosure generates relates to the field of medical technology, and in particular, to methods and systems for motion detection in magnetic resonance imaging.

BACKGROUND

Magnetic Resonance Imaging (MRI) is an imaging technology widely used in the medical field. In a magnetic resonance imaging process, it is often necessary for a scanned object to maintain a certain static state to prevent motion artifact(s) on an image and improve the imaging effect. However, it is difficult to know whether the scanned object moves before scanning sequence in the magnetic resonance imaging is completed. If the processing device can obtain the motion state of the scanned object in real time in the scanning process, it can help to better control the MRI process without affecting the imaging effect of the MRI when the motion amplitude of the scanned object is relatively large.

Therefore, it is desirable to provide methods and systems in magnetic resonance imaging for motion detection to improve the quality of motion detection.

SUMMARY

In one aspect of the present disclosure, a method for motion detection in magnetic resonance imaging is provided. The method implemented on at least one machine each of which has at least one processor and at least one storage device for motion detection may include: obtaining auxiliary magnetic resonance data of a target object by scanning the target object using an auxiliary sequence inserted in at least two imaging sub-sequences in a magnetic resonance imaging process of the target object, wherein the auxiliary sequence includes a plurality of auxiliary sub-sequences inserted at different positions in the at least two imaging sub-sequences; and determining, based on the auxiliary magnetic resonance data, motion state information of a region of interest of the target object.

In some embodiments, the method for motion detection may further include: determining a target correlation parameter of the auxiliary sequence based on a first correlation parameter of the at least two imaging sub-sequences, wherein the target correlation parameter includes at least one of a count of auxiliary sub-sequences included in the auxiliary sequence, a pulse excitation angle, or an insertion density of the auxiliary sequence in the at least two imaging sub-sequences, and the first correlation parameter includes a sequence type of the at least two imaging sub-sequences.

In some embodiments, the auxiliary magnetic resonance data may be obtained based on one or more preset target readout directions by exciting one or more target slices in scanning the target object using the auxiliary sequence, wherein the one or more target readout directions correspond to the one or more target slices respectively.

In some embodiments, at least one of the one or more target slices or the one or more target readout directions may be determined based on a second correlation parameter of the at least two imaging sub-sequences.

In some embodiments, the second correlation parameter may include at least one excitation slice and at least one readout direction in scanning the target object using the at least two imaging sub-sequences.

In some embodiments, at least one of the one or more target slices or the one or more target readout directions may be determined based on a spatial distribution of an imaging part of the target object.

In some embodiments, at least one of the one or more target slices or the one or more target readout directions may be determined based on a position of the region of interest.

In some embodiments, processed magnetic resonance data may be obtained by preprocessing, based on the one or more target readout directions, the auxiliary magnetic resonance data; and the motion state information of the region of interest may be determined based on the processed magnetic resonance data.

In some embodiments, partial data related to a target feature may be obtained in the auxiliary magnetic resonance data; and the motion state information of the region of interest may be determined based on the partial data.

In some embodiments, reference data may be determined based on a first sub-set of auxiliary magnetic resonance data obtained using a first auxiliary sub-sequence of the plurality of auxiliary sub-sequences; and target data may be determined based on a second sub-set of auxiliary magnetic resonance data obtained using a second auxiliary sub-sequence of the plurality of auxiliary sub-sequences; a difference between the reference data and the target data may be determined; and the motion state information of the region of interest may be determined according to the difference.

In some embodiments, the method for motion detection may further include: performing a phase filtering processing on the auxiliary magnetic resonance data.

In some embodiments, first data related to a first direction of the region of interest and second data related to a second direction of the region of interest may be obtained in the auxiliary magnetic resonance data, wherein an influence of an interfering motion in the first direction is stronger than an influence of an interfering motion in the second direction; and the motion state information of the region of interest may be determined according to the first data and the second data.

In some embodiments, the first data may be divided into at least two first segments along the first direction; a first motion state of each of the at least two first segments may be determined; the second data may be divided into at least two second segments along the second direction; a second motion state of each of the at least two second segments may be determined; a first difference between first motion states of the at least two first segments may be determined; a second difference between second motion states of the at least two second segments may be determined; and whether the auxiliary magnetic resonance data is affected by the interfering motion may be determined according to the first difference and the second difference.

In some embodiments, the determining the motion state information of the region of interest according to the first data and the second data may further include: in response to determining that the auxiliary magnetic resonance data is affected by the interfering motion, setting a first weight of the first data and a second weight of the second data, the first weight being smaller than the second weight; and determining the motion state information of the region of interest according to the first weight and the second weight.

In some embodiments, the determining the motion state information of the region of interest according to the first data and the second data may further include: in response to determining that the auxiliary magnetic resonance data is affected by the interfering motion, determining the motion state information of the region of interest according to the second data.

In some embodiments, boundary data in the auxiliary magnetic resonance data may be determined; and the motion state information of the region of interest may be determined according to the boundary data.

In another aspect of the present disclosure, a system for motion detection in magnetic resonance imaging is provided. The system may include: at least one storage device storing a set of instructions; and at least one processor in communication with the storage device, wherein when executing the set of instructions, the at least one processor is configured to cause the system to perform operations including: obtaining auxiliary magnetic resonance data of a target object by scanning the target object using an auxiliary sequence inserted in at least two imaging sub-sequences in a magnetic resonance imaging process of the target object, wherein the auxiliary sequence includes a plurality of auxiliary sub-sequences inserted at different positions in the at least two imaging sub-sequences; and determining, based on the auxiliary magnetic resonance data, motion state information of a region of interest of the target object.

In some embodiments, the auxiliary magnetic resonance data may be obtained based on one or more preset target readout directions by exciting one or more target slices in scanning the target object using the auxiliary sequence, wherein the one or more target readout directions correspond to the one or more target slices respectively.

In some embodiments, partial data related to a target feature may be obtained in the auxiliary magnetic resonance data; and the motion state information of the region of interest may be determined based on the partial data.

In still another aspect of the present disclosure, a non-transitory computer-readable storage medium including at least one set of computer instructions is provided. When a processor of a computer executes the at least one set of computer instructions, the computer may perform operations including: obtaining auxiliary magnetic resonance data of the target object by scanning a target object using an auxiliary sequence inserted in at least two imaging sub-sequences in a magnetic resonance imaging process of the target object, wherein the auxiliary sequence includes a plurality of auxiliary sub-sequences inserted at different positions in the at least two imaging sub-sequences; and determining, based on the auxiliary magnetic resonance data, motion state information of a region of interest of the target object.

In still yet another aspect of the present disclosure, a method implemented on at least one machine each of which has at least one processor and at least one storage device for magnetic resonance imaging is provided. The method may include: obtaining auxiliary magnetic resonance data of a target object by scanning the target object using an auxiliary sequence inserted in at least two imaging sub-sequences in a magnetic resonance imaging process of the target object, wherein the auxiliary sequence includes a plurality of auxiliary sub-sequences inserted at different positions in the at least two imaging sub-sequences; determining, based on the auxiliary magnetic resonance data, motion state information of a region of interest of the target object; and obtaining magnetic resonance imaging data of the region of interest of the target object by controlling, based on the motion state information of the region of interest, an imaging scan related to the at least two imaging sub-sequences performed on the target object.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, wherein:

FIG. 3 is a flowchart illustrating an exemplary process for motion detection in magnetic resonance imaging according to some embodiments of the present disclosure;

FIG. 6 is a flowchart illustrating an exemplary process for motion detection in magnetic resonance imaging according to some embodiments of the present disclosure;

DETAILED DESCRIPTION

Figure 1:
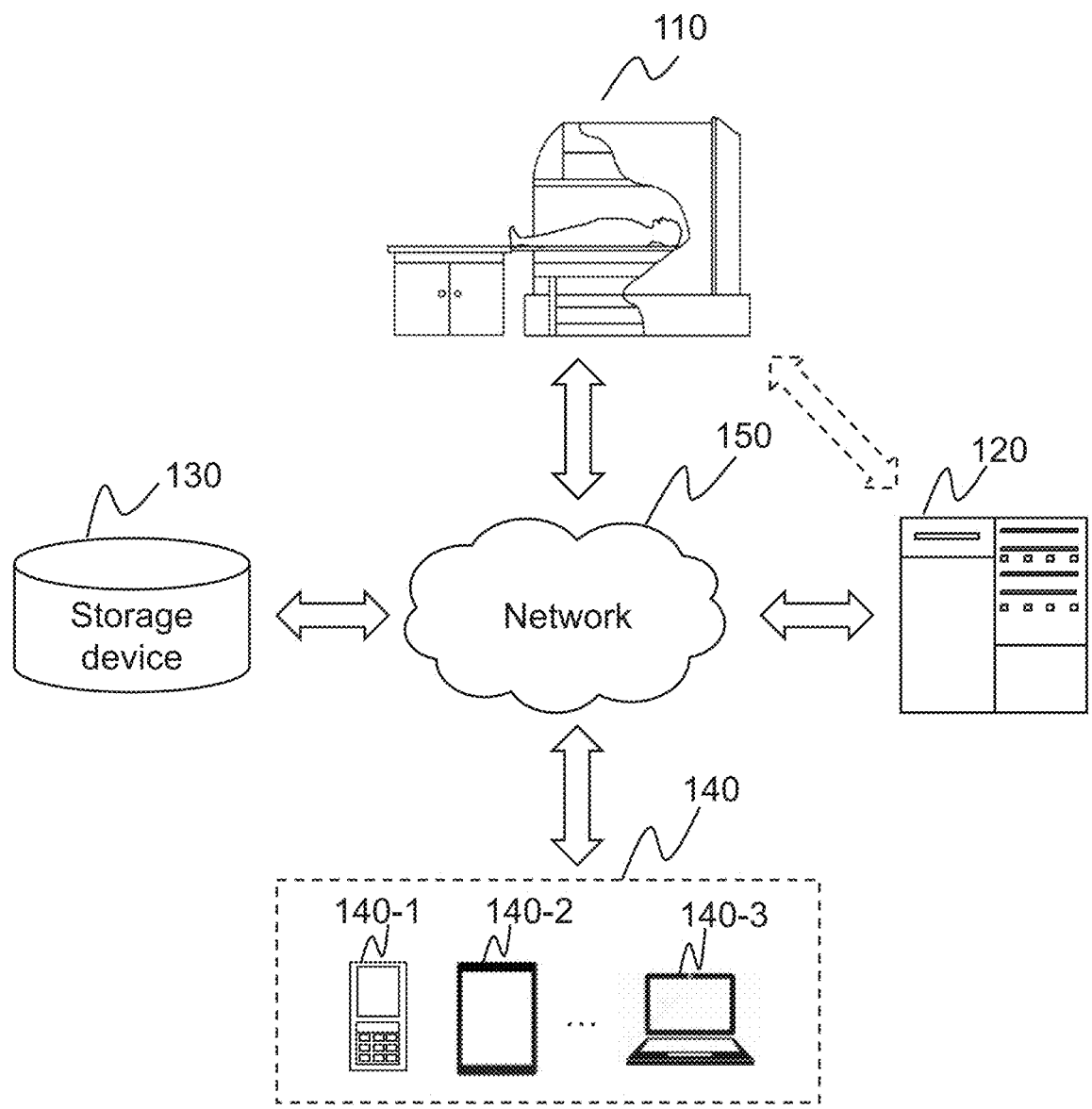
FIG. 1 is a schematic diagram illustrating an exemplary application scenario of a system for motion detection in magnetic resonance imaging according to some embodiments of the present disclosure.

In order to more clearly illustrate the technical solutions related to the embodiments of the present disclosure, a brief introduction of the drawings referred to the description of the embodiments is provided below. Obviously, the drawings described below are only some examples or embodiments of the present disclosure. Those having ordinary skills in the art, without further creative efforts, may apply the present disclosure to other similar scenarios according to these drawings. Unless obviously obtained from the context or the context illustrates otherwise, the same numeral in the drawings refers to the same structure or operation.

It should be understood that the "system," "device," "unit," and/or "module" used herein are one method to distinguish different components, elements, parts, sections, or assemblies of different levels. However, if other words can achieve the same purpose, the words can be replaced by other expressions.

As used in the disclosure and the appended claims, the singular forms "a," "an," and "the" include plural referents unless the content clearly dictates otherwise; the plural forms may be intended to include singular forms as well. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements.

The flowcharts used in the present disclosure illustrate operations that systems implement according to some embodiments in the present disclosure. It should be understood that the foregoing or following operations may not necessarily be performed exactly in order. Instead, the operations may be processed in reverse order or simultaneously. Besides, one or more other operations may be added to these processes, or one or more operations may be removed from these processes.

In some embodiments, a motion state of a scanned object in real time in a scanning process using a method for motion detection based on a magnetic resonance sequence. In some embodiments, scanning may be terminated in advance for a large motion to avoid wasting time. K-space data affected by the motion may be acquired supplementarily and re-acquired, motion data may be removed for reconstruction, and a corrected image may be obtained. The method for motion detection based on the magnetic resonance sequence may obtain a real-time motion state by comparing and calculating magnetic resonance signals acquired at different times. However, the method for motion detection based on the magnetic resonance sequence may have the following problems: due to various factors such as field drift and temperature rise in a scanning process, there may be a certain phase error in the acquired magnetic resonance signals, which may affect calculation of a motion curve; when a part such a head is scanned, the motion curve may change due to an action such as swallowing of a mouth, which may be usually not an region of interest; when a part such as a pelvis and abdomen is scanned, the motion curve may change due to an involuntary action such as peristalsis. In some embodiments of the present disclosure, motion detection methods and systems in magnetic resonance imaging to improve the quality of motion detection.

FIG. 1 is a schematic diagram illustrating an exemplary application scenario of a system for motion detection in magnetic resonance imaging according to some embodiments of the present disclosure. In some embodiments, the system 100 (for motion detection) may be a magnetic resonance imaging system.

As shown in FIG. 1, in some embodiments, the system 100 may include a medical imaging device 110, a processing device 120, a storage device 130, a terminal 140, and a network 150.

The medical imaging device 110 refers to a device that reproduces an internal structure of a human body as an image using different media in medicine. In some embodiments, the medical imaging device 110 may be any medical device that images a designated body part of a patient based on a magnetic resonance imaging technology, such as Magnetic Resonance Imaging (MRI), PET-MR (Positron Emission Tomography-Magnetic Resonance), etc. The medical imaging device 110 provided above is merely provided for the purpose of illustration and not intended to limit the scope. The medical imaging device 110 may include a plurality of imaging modules and/or use sub-sequence(s) for imaging a scanned object (e.g., human body, etc.). In some embodiments, the medical imaging device 110 may include an auxiliary sub-sequence (also referred to as a navigation sequence) inserted in each repetition time (TR) of an imaging sub-sequence to obtain magnetic resonance signal(s) (i.e., auxiliary magnetic resonance data, also referred to as motion detection data) for motion detection. In some embodiments, the medical imaging device 110 may send the obtained magnetic resonance signal(s) (e.g., the magnetic resonance signal(s) for motion detection, the magnetic resonance signal(s) for imaging, etc.) to the processing device 120. In some embodiments, the medical imaging device 110 may receive instruction(s) sent by a user (e.g., a doctor) through the terminal 140 and perform related operation(s) (e.g., irradiation imaging, etc.) according to the instruction(s). In some embodiments, the medical imaging device 110 may exchange data and/or information with other components (e.g., the processing device 120, the storage device 130, and/or the terminal 140) in the system 100 through the network 150. In some embodiments, the medical imaging device 110 may be directly connected to other components in the system 100. In some embodiments, one or more components (e.g., the processing device 120, the storage device 130) in the system 100 may be disposed in the medical imaging device 110.

The processing device 120 may process data and/or information obtained from other device(s) or system component(s) and/or perform the motion detection process and/or the magnetic resonance imaging process shown in some embodiments of the present disclosure based on the data, information and/or a processing result to complete one or more of the functions described in some embodiments of the present disclosure. For example, the processing device 120 may obtain a motion state of the scanned object (e.g., a motion curve, etc.) based on the magnetic resonance signal(s) of the medical imaging device 110. As another example, the processing device 120 may correct the magnetic resonance signal(s)/data based on the motion state (e.g., the motion curve, etc.) of the scanned object and obtain a corrected magnetic resonance image through reconstruction. In some embodiments, the processing device 120 may send the processed data (e.g., the motion curve, etc.) to the storage device 130 for storage. In some embodiments, the processing device 120 may obtain pre-stored data and/or information (e.g., the magnetic resonance signal for motion detection, an equation for motion detection, etc.) from the storage device 130 for performing the motion detection process in magnetic resonance imaging shown in some embodiments of the present disclosure, e.g., obtaining motion state information of the scanned object, etc.

In some embodiments, the processing device 120 may include one or more sub-processing devices (e.g., a single-core processing device or a multi-core processing device). Merely by way of example, the processing device 120 may include a central processing unit (CPU), an application specific integrated circuit (ASIC), a graphics processing unit (GPU), a digital signal processor (DSP), a field programmable gate array (FPGA), a reduced instruction set Computer (RISC), a microprocessor, or the like, or any combination thereof.

The storage device 130 may store data or information generated by other devices. In some embodiments, the storage device 130 may store data and/or information (e.g., the magnetic resonance signal for motion detection, the magnetic resonance signal for imaging, etc.) acquired by the medical imaging device 110. In some embodiments, the storage device 130 may store the data and/or information (e.g., a motion curve, etc.) processed by the processing device 120. The storage device 130 may include one or more storage components, and each storage component may be an independent device or a part of other device(s). The storage device may be local or via the cloud.

The terminal 140 may control the operation of the medical imaging device 110. The user may issue an operation instruction to the medical imaging device 110 through the terminal 140, so that the medical imaging device 110 may perform a specified operation, for example, imaging a specified body part of the scanned object. In some embodiments, the terminal 140 may instruct the processing device 120 to perform the motion detection process in magnetic resonance imaging and/or the magnetic resonance imaging process according to some embodiments of the present disclosure. In some embodiments, the terminal 140 may receive the corrected magnetic resonance image and/or motion curve from the processing device 120, so that the doctor may determine a physical condition and/or motion state of the scanned object. In some embodiments, the terminal 140 may be a device with an input function and/or an output function such as a mobile device 140-1, a tablet computer 140-2, a laptop computer 140-3, a desktop computer, or the like, or any combination thereof.

The network 150 may connect various components of the system and/or connect the system to an external resource. The network 150 may enables communication between the various components and/or between the component(s) and other component(s) outside the system, thereby facilitating the exchange of data and/or information. In some embodiments, one or more components (e.g., the medical imaging device 110, the processing device 120, the storage device 130, and/or the terminal 140) in the system 100 may send data and/or information to other component(s) through the network 150. In some embodiments, the network 150 may include a wired network, a wireless network, or any combination thereof.

It should be noted that the above description is merely provided for the purpose of illustration and is not intended to limit the scope of the present disclosure. For those skilled in the art, various changes and modifications may be made under the guidance of the contents of the present disclosure. The features, structures, methods, and other features of the exemplary embodiments described in the present disclosure may be combined in various ways to obtain additional and/or alternative exemplary embodiments. For example, the processing device 120 may be based on a cloud computing platform, such as public cloud, private cloud, community cloud, hybrid cloud, etc. However, those changes and modifications do not depart from the scope of the present disclosure.

Figure 2:
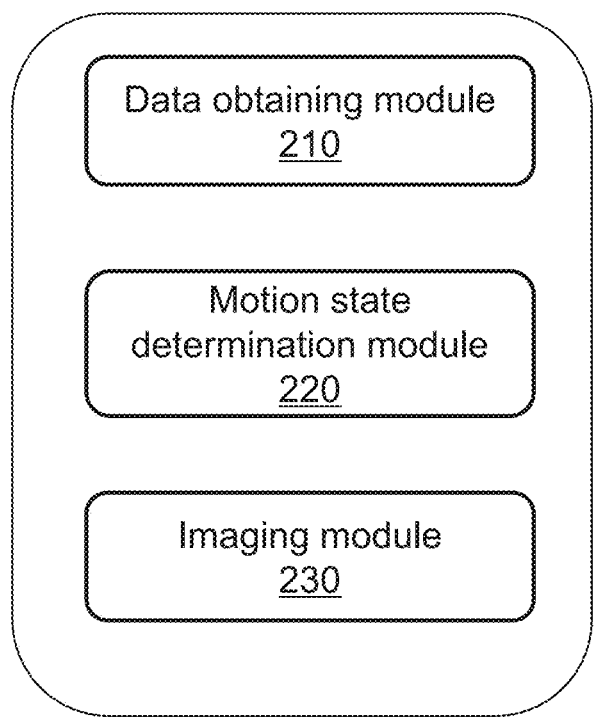
FIG. 2 is a schematic diagram illustrating an exemplary system for magnetic resonance imaging according to some embodiments of the present disclosure.

FIG. 2 is a schematic diagram illustrating an exemplary system for magnetic resonance imaging according to some embodiments of the present disclosure.

As shown in FIG. 2, in some embodiments, the magnetic resonance imaging system 200 may include a data obtaining module 210 and/or a motion state determination module 220. In some embodiments, the magnetic resonance imaging system 200 may further include an imaging module 230. In some embodiments, the data obtaining module 210, the motion state determination module 220, and/or the imaging module 230 may be implemented by the processing device 120.

In some embodiments, the data obtaining module 210 may be configured to obtain auxiliary magnetic resonance data of a target object by scanning the target object using an auxiliary sequence inserted in at least two imaging sub-sequences in a magnetic resonance imaging process of the target object. The auxiliary sequence may include a plurality of auxiliary sub-sequences inserted at different positions in the at least two imaging sub-sequences.

In some embodiments, the motion state determination module 220 may be configured to determine, based on the auxiliary magnetic resonance data, motion state information of a region of interest of the target object.

In some embodiments, the imaging module 230 may be configured to obtain magnetic resonance imaging data of the region of interest of the target object by controlling, based on the motion state information of the region of interest, an imaging scan related to the at least two imaging sub-sequences performed on the target object.

In some embodiments, the data obtaining module 210 and the motion state determination module 220 may form a motion detection system in magnetic resonance imaging.

FIG. 3 is a flowchart illustrating an exemplary process for motion detection in magnetic resonance imaging according to some embodiments of the present disclosure. In some embodiments, one or more operations of the process 300 shown in FIG. 3 may be implemented by the system 100 shown in FIG. 1. For example, the process 300 shown in FIG. 3 may be stored in a storage medium of the processing device 120 in the form of instruction(s) and called and/or executed by a processing device (e.g., the processing device 120). For the purpose of illustration, the execution of the process 300 is described below using the processing device 120 as an example.

As shown in FIG. 3, the process 300 may include one or more of the following operations.

In 310, the processing device 120 may obtain auxiliary magnetic resonance data of a target object by scanning the target object using an auxiliary sequence inserted in at least two imaging sub-sequences in a magnetic resonance imaging process of the target object. The auxiliary sequence may include a plurality of auxiliary sub-sequences inserted at different positions in the at least two imaging sub-sequences. In some embodiments, the operation 310 may be performed by the data obtaining module 210.

The target object may be a scanned object of the magnetic resonance imaging, such as a human body, an animal, a phantom, etc. In some embodiments, the target object may include a body part of the human body, e.g., a head, a neck, a chest, an abdomen, etc. An imaging sub-sequence may also be referred to an imaging sequence used for imaging by a medical imaging device (e.g., the medical imaging device 110). There may be a plurality of imaging sub-sequences, and each imaging sub-sequence may correspond to a repetition time (TR). The auxiliary sequence may be a magnetic resonance scan sequence (or operation) used for motion detection by a medical imaging device (e.g., MRI). A count of the auxiliary sequence may be one or more. In some embodiments, the processing device 120 may scan the target object using the imaging sub-sequence(s) and/or the auxiliary sequence(s) through the medical imaging device. The imaging sub-sequence(s) may be used to obtain magnetic resonance imaging data of the target object, and the auxiliary sequence may be used to obtain the auxiliary magnetic resonance data of the target object. The magnetic resonance imaging data refers to data corresponding to magnetic resonance signal(s) used to obtain a scanning image. The auxiliary magnetic resonance data refers to data corresponding to magnetic resonance signal(s) used for motion detection. The magnetic resonance signal(s) may be echo signal(s) obtained by scanning the target object (e.g., the head, the abdomen, etc.) using the medical imaging device (e.g., MRI, etc.).

Figure 8:
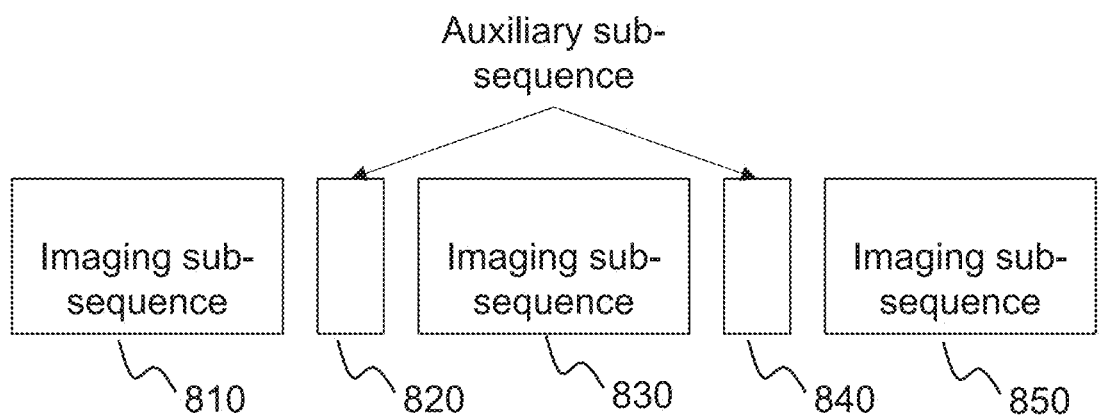
FIG. 8 is a schematic diagram illustrating imaging sub-sequences and auxiliary sub-sequences according to some embodiments of the present disclosure.

In some embodiments, the auxiliary sequence may be inserted into two or more imaging sub-sequences. The auxiliary sequence may include the plurality of auxiliary sub-sequences inserted at different positions in the at least two imaging sub-sequences. A magnetic resonance scanning sequence may include a plurality of TRs, and each TR may correspond to an imaging sub-sequence. In some embodiments, one or more auxiliary sub-sequences (e.g., at least two auxiliary sub-sequences corresponding to different directions) may be inserted into each TR of the magnetic resonance scanning sequence. The auxiliary sub-sequences may be adjacent to each other, or the auxiliary sub-sequences may be executed simultaneously. In some embodiments, the auxiliary sub-sequence inserted in a TR may be adjacent to the imaging sub-sequence(s) in the TR. For example, at least one auxiliary sub-sequence may be inserted before or after the imaging sub-sequence(s) in the TR. Therefore, at least one auxiliary sub-sequence may be inserted between two adjacent imaging sub-sequences, and the two adjacent imaging sub-sequences may belong to two adjacent TRs, respectively. FIG. 8 is a schematic diagram illustrating imaging sub-sequences and auxiliary sub-sequences according to some embodiments of the present disclosure. As shown in FIG. 8, the auxiliary sub-sequence 820 may be inserted between the imaging sub-sequences 810 and 830, and the auxiliary sub-sequence 840 may be inserted between the imaging sub-sequences 830 and 850. Each of the imaging sub-sequences 810, 830, and 850 may correspond to a TR.

In some embodiments of the present disclosure, the auxiliary sub-sequence may be added between the imaging sub-sequences (e.g., to the interval(s) between the imaging sub-sequences) for the motion detection. By adjusting parameter(s) of the auxiliary sub-sequence, it may be achieved that the auxiliary sub-sequence basically does not interfere with the imaging sub-sequence(s), and there is basically no significant increase in a scanning time. In some embodiments, the duration of the auxiliary sub-sequence may be shorter than a duration of the imaging sub-sequence(s). For example, the duration of the auxiliary sub-sequence may be 1 milliseconds-20 milliseconds. In some embodiments, the magnetic resonance signal(s) acquired according to the auxiliary sub-sequence may be used for motion detection of the target object, but not for imaging of the target object.

Figure 9:
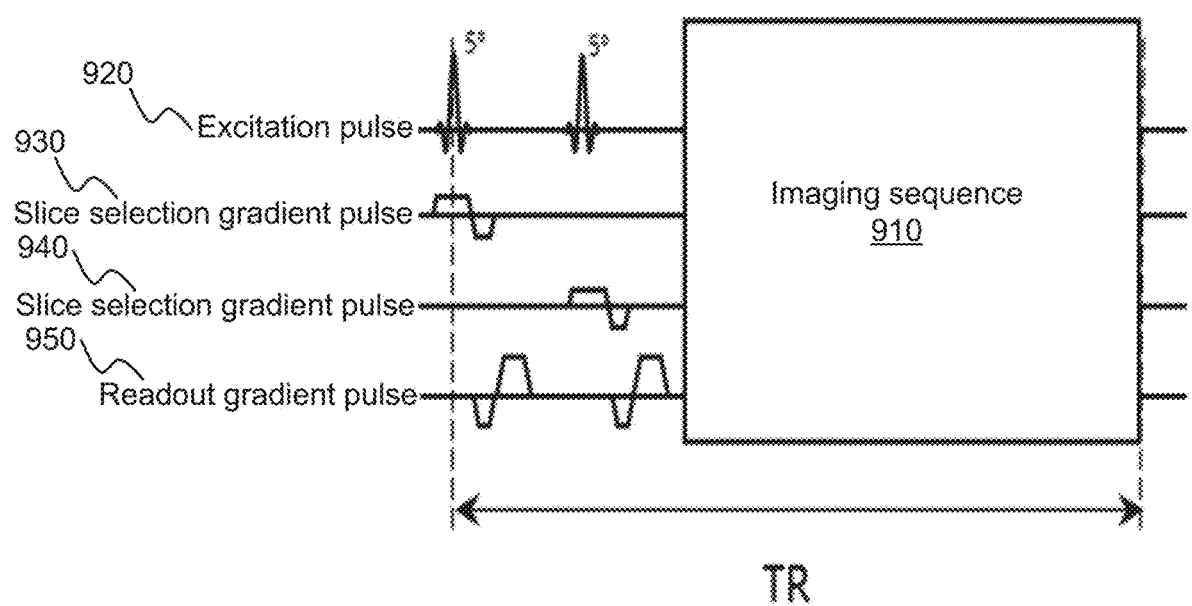
FIG. 9 is a schematic diagram illustrating imaging sub-sequence(s) and auxiliary sub-sequence(s) according to some embodiments of the present disclosure.

In some embodiments, the auxiliary sub-sequence may have any type of echo sequence, e.g., a Gradient Echo (GRE) sequence, a Fast Spin Echo (FSE) sequence, an Echo Planar Imaging (EPI) sequence, etc. In some embodiments, the types of the auxiliary sub-sequence and that of the imaging sub-sequence(s) may be the same or different. In some embodiments, the auxiliary sub-sequence may include a radio frequency excitation pulse, a spatial encoding gradient pulse (including a slice selection gradient pulse, a readout gradient pulse, and/or a phase encoding gradient pulse), etc. In some embodiments, the auxiliary sub-sequence may include the excitation pulse, the slice selection gradient pulse, and/or the readout gradient pulse. FIG. 9 is a schematic diagram of an imaging sub-sequence and an auxiliary sub-sequence according to some embodiments of the present disclosure. As shown in FIG. 9, an imaging sequence 910 and an auxiliary sub-sequence may be distributed in a TR. The imaging sequence 910 may include the imaging sub-sequence, and the auxiliary sub-sequence may include the excitation pulse 920, the slice selection gradient pulses 930 and/or 940, and/or the readout gradient pulse 950. In some embodiments, the excitation pulse (e.g., the excitation pulse 920) and the slice selection gradient pulse (e.g., the slice selection gradient pulses 930 and/or 940) may be applied to the target object simultaneously without applying a phase encoding gradient pulse, so that an excited slice of the target object may generate the echo signal(s) (i.e., the magnetic resonance signal(s)) and apply the readout gradient pulse (e.g., the readout gradient pulse 950) within a short echo time to read the echo signal(s) of the target object along the signal readout direction. The echo signal(s) may be used as the auxiliary magnetic resonance data, which may be one-dimensional signal(s) of the excited slice along the signal readout direction and may characterize the motion state information of the target object.

The region of interest may be a target scanning region of the medical imaging device. The region of non-interest may be a region outside the target scanning region of the medical imaging device. The region of interest and the region of non-interest may be any part of the human body, e.g., the head, the abdomen, etc. In some embodiments, the processing device 120 may obtain at least two sub-sets of auxiliary magnetic resonance data of the region of interest by performing two or more auxiliary sub-sequences in a scanning process of the region of interest by the medical imaging device. Each auxiliary sub-sequence may correspond to a sub-set of auxiliary magnetic resonance data, and each auxiliary sub-sequence may be inserted into two imaging sub-sequences. In some embodiments, the processing device 120 may obtain the auxiliary magnetic resonance data of the region of non-interest by performing the auxiliary sub-sequence(s) in the scanning process of the region of non-interest by the medical imaging device.

In some embodiments, the processing device 120 may determine a target correlation parameter of the auxiliary sequence based on a first correlation parameter of the at least two imaging sub-sequences. The target correlation parameter may include at least one of a count of auxiliary sub-sequence(s) included in the auxiliary sequence, a pulse excitation angle of the auxiliary sub-sequence(s) included in the auxiliary sequence, or an insertion density of the auxiliary sequence in the at least two imaging sub-sequences. The first correlation parameter may include a sequence type of the at least two imaging sub-sequences. In some embodiments, the pulse excitation angles of a plurality of auxiliary sub-sequences included in the same auxiliary sequence may be the same or different.

In some embodiments, since the magnetic resonance signals acquired based on different imaging sub-sequences have different anti-interference properties, the processing device 120 may match different auxiliary sub-sequences for different types of imaging sub-sequences.

Merely by way of example, if the GRE sequence has a relatively high requirement for a steady state of signal evolution, the density of inserted auxiliary sub-sequence(s) may not be too high (for example, an insertion interval may be at least 2 TRs), and a flip angle of the excitation pulse used by the auxiliary sub-sequence(s) may not be too large (for example, a value range of the flip angle of the excitation pulse may be [4°, 15°], preferably 5°). For the FSE sequence and the EPI sequence, the inserted auxiliary sub-sequence(s) may be relatively dense, the insertion interval may be relatively short (e.g., 1 TR or even shorter), and the flip angle of the excitation pulse of the auxiliary sub-sequence(s) may be set relatively large (e.g., greater than 5°).

In some embodiments, the processing device 120 may adjust the parameter(s) of the auxiliary sub-sequence(s) (for example, the excitation slice(s), the flip angle(s), the readout direction, etc.) based on the inserted imaging sub-sequence(s) and a current scanning part, so as to obtain the magnetic resonance signal(s) that can reflect the motion state of the scanned object in the imaging process using the imaging sub-sequence(s) in real time. The magnetic resonance signal(s) may be used for subsequent calculation, so as to obtain a curve that can reflect the motion state of the scanned object.

In some embodiments, the excitation slice of the auxiliary sub-sequence(s) and the imaging sub-sequence(s) may be the same or different. In some embodiments, merely one-dimensional spatial encoding may be performed because the data obtained by the auxiliary sub-sequence(s) is not used for imaging. For example, the encoding gradient may merely be applied in one direction (e.g., one of a slice selection direction, the readout direction, a phase encoding direction, etc.) in the auxiliary sub-sequence(s). Optionally, the auxiliary sub-sequence may also apply the encoding gradient in at least two directions (e.g., at least two of the slice selection direction, the readout direction, and the phase encoding direction, etc.).

Merely by way of example, if an auxiliary sub-sequence includes a spin echo sequence (e.g., SE or FSE sequence), the flip angle of the excitation pulse in the auxiliary sub-sequence may not need to be 90 degrees, and a flip angle smaller than 90 degrees (e.g., 3-5 degrees) may be used, reducing an acquisition time of the auxiliary sub-sequence without affecting the imaging sub-sequence.

As another example, if an imaging sub-sequence includes a GRE sequence, in order to ensure the steady state of a GRE signal of the imaging sub-sequence, the auxiliary sub-sequence may also include a GRE sequence, and the flip angle and the excitation slice of the auxiliary sub-sequence may be similar to those of the imaging sub-sequence.

In some embodiments, the processing device 120 may obtain, based on one or more preset target readout directions, the auxiliary magnetic resonance data by exciting one or more target slices in scanning the target object using the auxiliary sequence. The one or more target readout directions may correspond to the one or more target slices respectively.

In some embodiments, each of the one or more preset target slices may have a target readout direction corresponding to the target slice.

In some embodiments, the auxiliary sequence may include at least two auxiliary sub-sequences. Each auxiliary sub-sequence may include a slice selection gradient pulse and/or a readout gradient pulse corresponding to the slice selection gradient pulse. The target slices and/or the target readout directions of the auxiliary sub-sequences may be different. For example, the readout directions of the readout gradient pulses may be orthogonal to each other. In some embodiments, the auxiliary sequence may include a first auxiliary sub-sequence and a second auxiliary sub-sequence that are continuous in time sequence. The first auxiliary sub-sequence and the second auxiliary sub-sequence may be located in the same TR. In some embodiments, the first auxiliary sub-sequence and the second auxiliary sub-sequence may respectively excite different slices (i.e., the first auxiliary sub-sequence and the second auxiliary sub-sequence may have different target slices), and the readout gradient directions of the first auxiliary sub-sequence and the second auxiliary sub-sequence may be orthogonal (i.e., the target readout directions of the first auxiliary sub-sequence and the second auxiliary sub-sequence may be orthogonal).

In some embodiments, the target slice of the auxiliary sub-sequence may not overlap with the excitation slice of the imaging sub-sequence. Specifically, the target slice(s) of the auxiliary sub-sequence may not include or be interfered by the signal(s) from the excitation slice(s) of the imaging sub-sequence(s) and other interference part(s). Merely by way of example, if both the excitation pulse and a convergence pulse of an imaging sub-sequence are pulses with a large flip angle, and the target slice selected for an auxiliary sub-sequence overlap with the excitation slice of an imaging sub-sequence, then residual signal(s) not recovered after excitation of the imaging sub-sequence of a previous TR may be mixed into the echo signal(s) acquired by the auxiliary sub-sequence. Since the residual signal(s) are difficult to reach the steady state, there may be a relatively large difference between the echo signals acquired by the auxiliary sub-sequence in testing a static part, which may lead to misjudgment of the motion state of the part. For example, when a head motion is detected, if the excitation slice of the auxiliary sub-sequence is in a sagittal position and the signal readout direction is in an anterior-posterior direction, the acquired echo signal(s) may be mixed into motion information of a trunk below the head, making it hard to judge or analyze the head motion alone. Therefore, signal interference(s) can be effectively avoided by making the excitation slice(s) of the auxiliary sub-sequence(s) not overlap with that of the imaging sub-sequence(s).

For different target objects, the excitation slices suitable for detecting motion information may usually be different. Therefore, in some embodiments, the processing device 120 may match the different target objects using different auxiliary sequences.

In some embodiments, a two-dimensional (2D) imaging sequence (also referred to as an imaging sub-sequence for 2D imaging) and a three-dimensional (3D) imaging sequence (also referred to as an imaging sub-sequence for 3D imaging) may use different auxiliary sequences. The auxiliary sequences may use different slice selection gradient pulses and readout gradient pulses.

In some embodiments, at least one of the target slice(s) and the target readout direction(s) may be determined based on a second correlation parameter of the imaging sub-sequence(s). In some embodiments, the second relevant parameter may include at least one excitation plane and/or at least one readout direction in scanning the target object using the at least two imaging sub-sequences.

In some embodiments, in the 2D imaging sequence, the slice selection direction and/or the signal readout direction (i.e., target readout direction) of the excitation slice (i.e., the target slice) of the auxiliary sub-sequence may be determined/adjusted according to the excitation slice of the imaging sub-sequence.

In some embodiments, if the imaging sub-sequence is the 2D imaging sequence, the target slice(s) of the auxiliary sub-sequence may be located at a transverse position, and the position(s) of the target slice(s) may be generally selected at several slices in the middle of the region of interest. For example, in order to obtain motion information in two directions, two slices may be selected to be excited, and the signal readout directions of the two slices may be orthogonal to each other.

Figure 11:
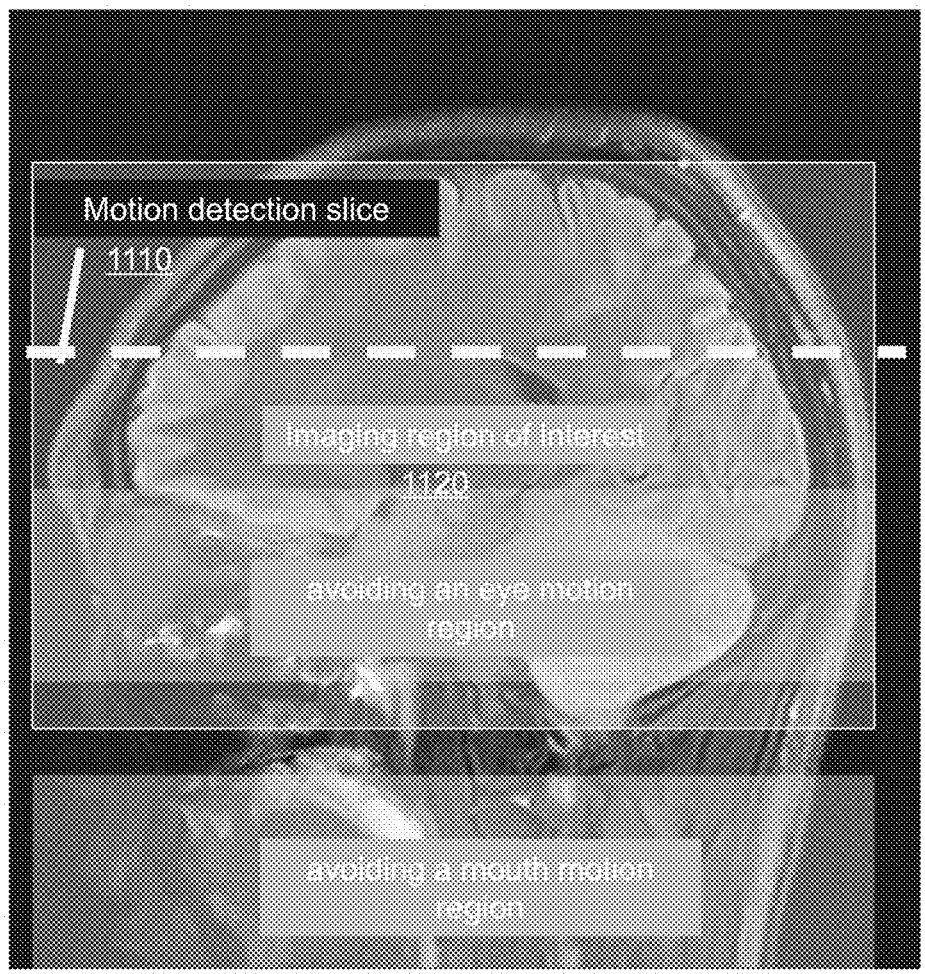
FIG. 11 is a schematic diagram illustrating selecting an excitation slice according to some embodiments of the present disclosure.

In some embodiments, the target slice(s) and/or the target readout direction(s) may be adjusted according to a part of the target object. For example, as shown in FIG. 11, if a head is imaged, the excitation slice of the auxiliary sub-sequence may need to bypass a part that has involuntary physiological motion but do not affect the imaging (such as a mouth, or the like) as much as possible. Therefore, a motion detection slice 1110 adjacent to the imaging region of interest 1120 may bypass an eye motion region and/or a mouth motion region. As another example, if a shoulder joint is imaged, the excitation slice of the auxiliary sub-sequence may bypass a main artery as much as possible to prevent blood flow from interfering with motion detection. In some embodiments, the target readout direction may be different from an excitation slice direction of the imaging sub-sequence(s).

In some embodiments, the processing device 120 may identify the region of non-interest of the target object, determine a physical position of the region of non-interest, and determine an application position of the auxiliary sequence according to the physical position of the region of non-interest. The application position may not include the region of non-interest.

For example, if the imaging sub-sequence is the 2D imaging sequence, the target slice(s) and the target readout direction(s) of the auxiliary sub-sequence(s) may be shown in Table 1, where the target slice and the target readout direction are the target slice and the target readout direction of the auxiliary sub-sequence, respectively, slice selection of imaging sub-sequence is the excitation slice of the imaging sub-sequence (two-dimensional imaging sequence), and the Slice No. is a serial number of the target slice

TABLE 1

| Slice selection of imaging sub-sequence | Target slice | Target readout direction | Slice No. |
| --- | --- | --- | --- |
| Sagittal position | Transverse position | Anterior-posterior | 1 |
| | Sagittal position | Head-foot | 2 |

TABLE 1-continued

| Slice selection of imaging sub-sequence | Target slice | Target readout direction | Slice No. |
| --- | --- | --- | --- |
| Transverse position | Transverse position | Anterior-posterior | 1 |
| | Transverse position | Left-right | 2 |
| Coronal position | Transverse position | Left-right | 1 |
| | Sagittal position | Head-foot | 2 |

In some embodiments, at least one of the target slice(s) and the target readout direction(s) may be determined based on a spatial distribution of an imaging part of the target object. In some embodiments, in the 3D sequence, the slice selection direction (i.e., the target layer) of the excitation slice(s) of the auxiliary sub-sequence(s) may be determined according to the spatial distribution of the target object, and the signal readout direction(s) (i.e., the target readout direction(s)) may be determined accordingly.

Figure 12:
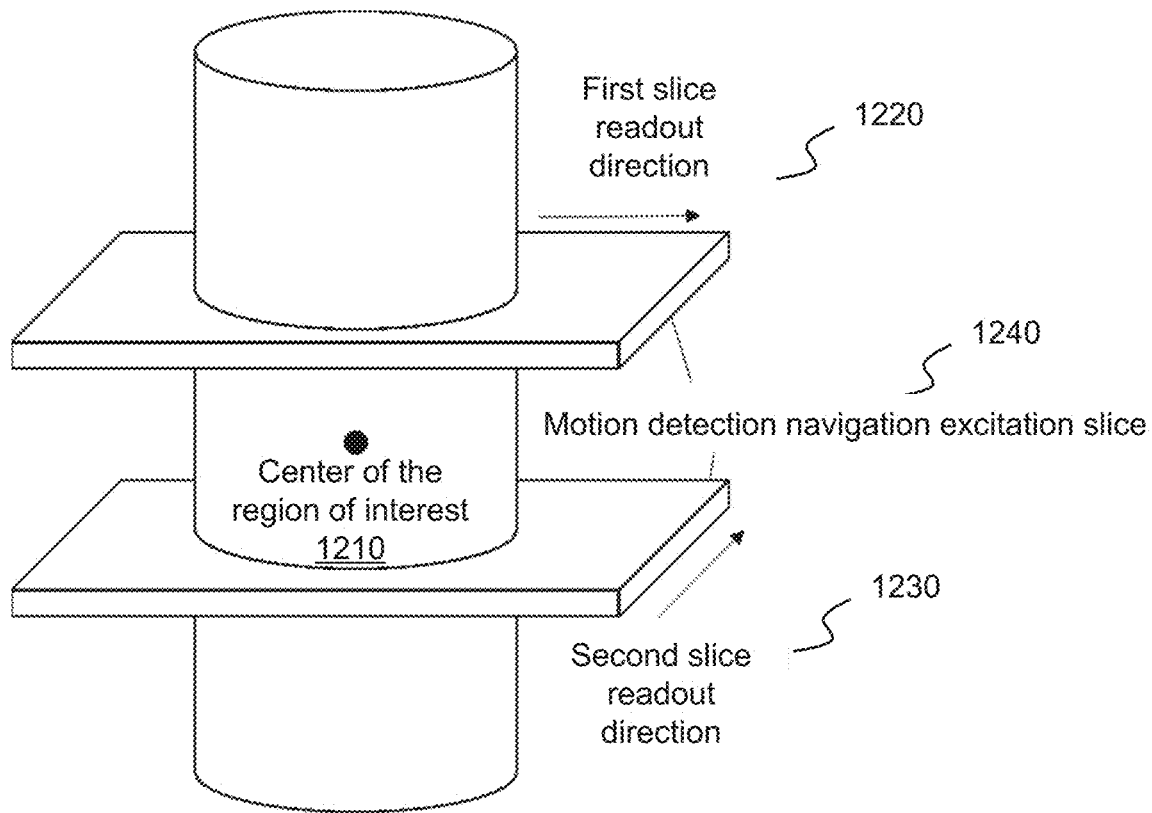
FIG. 12 is a schematic diagram illustrating selecting an excitation slice and a readout direction according to some embodiments of the present disclosure.

In some embodiments, if the imaging sub-sequence is a 3D imaging sequence, the processing device 120 may fix the excitation slice direction of the navigation sub-sequence at the transverse position, and dispose the target slices of the first auxiliary sub-sequence and the second auxiliary sub-sequence on both sides of the region of interest. For example, as shown in FIG. 12, the target slice is the motion detection navigation excitation slice 1240, the central cylinder is the target object, the positions of the two target slices are respectively radial planes along the axial symmetry of the cylinder and on the two sides of the center of the region of interest 1210 (i.e., the center of the central cylinder) separated by a certain distance, and the target readout directions (the first slice readout direction 1220 and the second slice readout direction 1230) are respectively set in the left-right and anterior-posterior directions.

In some embodiments, if the imaging part of the target object is a specific part (e.g., the joint), the target slice(s) may be selected from at least one of an oblique transverse plane, an oblique coronal plane, an oblique sagittal plane, etc., and the target readout directions of the different target slices may be mutually orthogonal directions.

Figure 13:
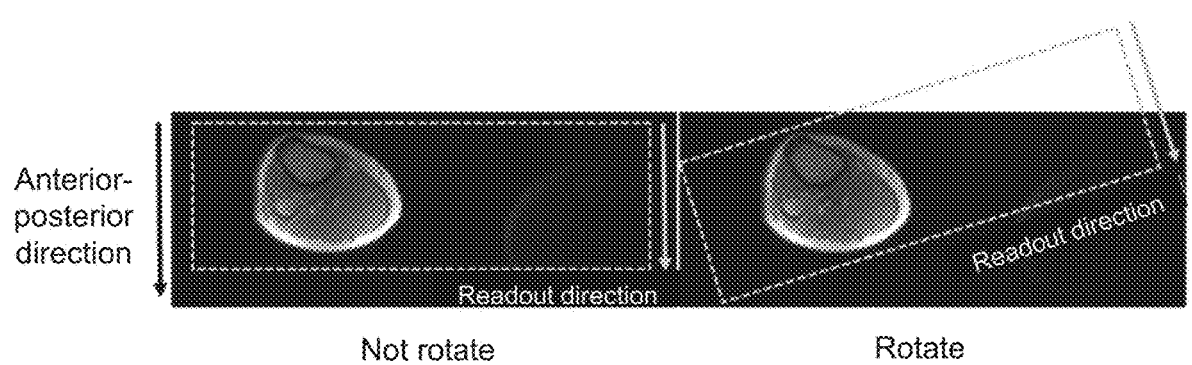
FIG. 13 is a schematic diagram illustrating selecting a readout direction according to some embodiments of the present disclosure.

In some embodiments, there may be an included angle between the readout gradient pulse included in the auxiliary sub-sequence(s) and the readout gradient pulse included in the imaging sub-sequence(s). In some embodiments, in imaging the target object, the processing device 120 may rotate the target readout direction(s) of the auxiliary sub-sequence(s) by a certain angle, so that the echo signal(s) inside and/or outside the region of interest acquired by the auxiliary sub-sequence(s) before and after the rotation may not overlap along the target readout direction(s), thereby solving a signal overlapping problem. As shown in FIG. 13, the direction of the readout gradient pulse(s) included in the imaging sub-sequence(s) is the anterior-posterior direction. In the image on the left, the target readout direction of the auxiliary sub-sequence does not rotate, and the target readout direction (the readout direction in the figure) is the left-right horizontal direction, which is perpendicular to the direction of the readout gradient pulse included in the imaging sub-sequence. In the image on the right, the target readout direction of the auxiliary sub-sequence in the left image is rotated by an angle.

In some embodiments, at least one of the target slice(s) or the target readout direction(s) may be determined based on a position of the region of interest. The processing device 120 may adjust the slice selection gradient pulse(s) and the readout gradient pulse(s) of the auxiliary sequence according to the position of the region of interest of the target object, that is, adjust the slice selection direction(s) and the signal readout direction(s) of the excitation pulse(s), so as to avoid as much as possible signal interference from region(s) outside the imaging region of interest.

In some embodiments, the processing device 120 may determine the spatial distribution of the region of interest according to the parameter(s) of the imaging sub-sequence(s), and determine parameter(s) of the slice selection gradient pulse(s) and the readout gradient pulse(s) in the auxiliary sequence according to the spatial distribution of the region of interest.

In order to avoid mutual interference between the imaging sequence and the navigation sequence, in some embodiments, if the excitation pulse(s) of the auxiliary sequence and the excitation pulse(s) of the imaging sub-sequence(s) are applied to the region of interest of the target object, the processing device 120 may set the flip angle(s) of the excitation pulse(s) of the auxiliary sequence to be relatively small. For example, the value range of the flip angle(s) may be [4°, 15°], preferably 5°.

Figure 10:
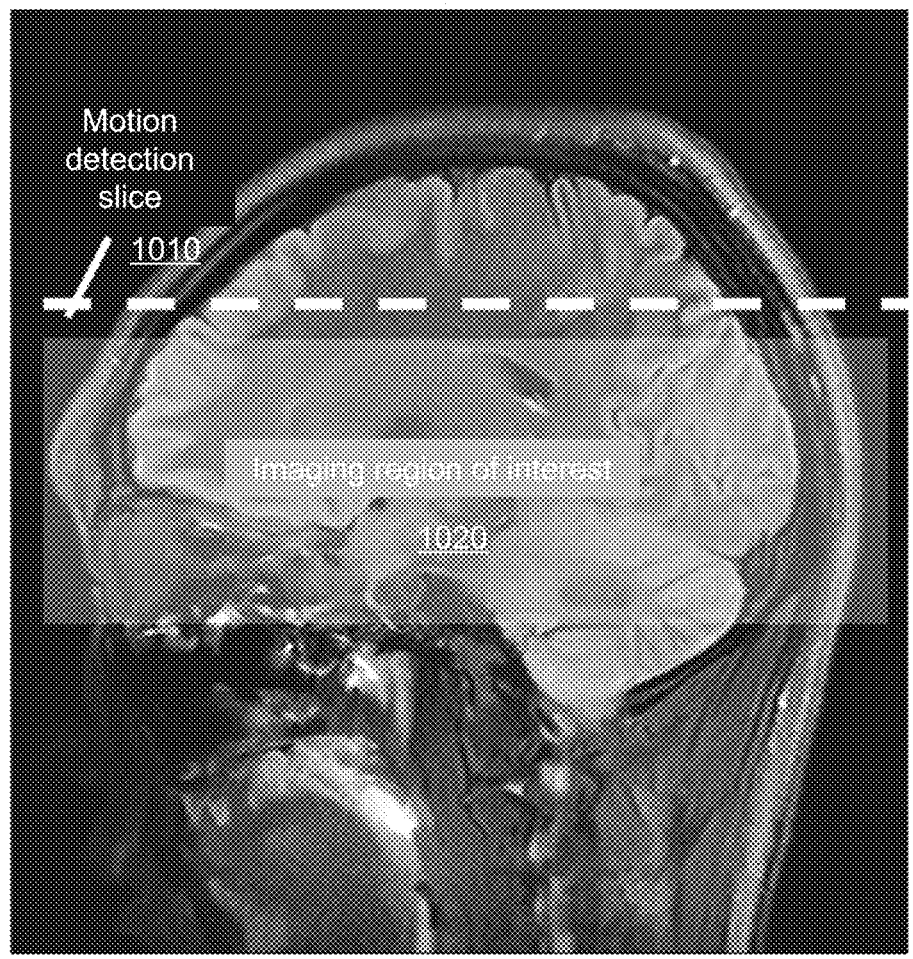
FIG. 10 is a schematic diagram illustrating selecting an excitation slice according to some embodiments of the present disclosure.

In some embodiments, if the excitation pulse(s) of the auxiliary sequence is applied to the region of non-interest of the target object, the processing device 120 may use an adjacent slice outside the region of interest as the motion detection slice, i.e., the target slice of the auxiliary sequence. For example, as shown in FIG. 10, the region of interest is an imaging region of interest 1020, and the processing device 120 may use the motion detection slice 1010 as the target slice of the auxiliary sequence. In some embodiments, at this time, the flip angle(s) of the excitation pulse(s) of the auxiliary sequence may be increased, so as to ensure the stability of the echo signal(s). For example, the value range of the flip angle(s) may be [60°, 180° ] (e.g., 90° or 180°).

In some embodiments, the processing device 120 may determine whether the excitation pulse(s) of the auxiliary sequence are applied to the region of interest or the region of non-interest according to the target object. For example, if the target object is a part with a large difference in a local motion state such as the neck, chest, and abdomen, the target slice(s) of the auxiliary sequence may be selected within the region of interest. As another example, if the target object is the head, legs, etc., where only approximate rigid body motion can occur, the target slice(s) of the auxiliary sequence may be selected not only in the region of interest, but also in the adjacent slice(s) outside the region of interest, the target readout direction(s) may be any direction in the slice(s).

In some embodiments of the present disclosure, different auxiliary sequences for motion detection may be set for different imaging sub-sequence types, which can ensure the validity and stability of echo signal(s) acquired by the auxiliary sequence(s); and different auxiliary sequence scanning parameters may be set for different parts of the target object, which can improve the accuracy of detecting the motion state of the target object.

In 320, the processing device 120 may determine, based on the auxiliary magnetic resonance data, the motion state information of the region of interest of the target object. In some embodiments, the operation 320 may be performed by the motion state determination module 220.

The motion state information refers to information reflecting the motion state of the target object, such as a motion offset, a motion direction, a motion curve, etc. The motion curve refers to a graph that can reflect the motion state of the scanned object (i.e., the target object) in scanning, for example, a curve with the abscissa of time and the ordinate of a value of r in Equation (4). In some embodiments, the motion state information may include motion state information of the region of interest and the region of non-interest. In some embodiments, the processing device 120 may determine, based on the auxiliary magnetic resonance data, the motion state information of the region of interest of the target object in various ways.

In some embodiments, the motion state information may include the motion offset. A position of each excitation of the auxiliary sub-sequence may be usually fixed, and a change of the position of the excitation may cause a change of the acquired echo signal. Therefore, in some embodiments, the processing device 120 may roughly estimate the motion offset of the target object by comparing a difference between the echo signal(s) and the reference signal(s). The reference signal(s) may include at least one of the echo signal(s) of the target object obtained by performing a first set of auxiliary sub-sequences, the echo signal(s) of the target object obtained by performing a previous set of auxiliary sub-sequences, etc.

In some embodiments, the processing device 120 may determine the data of the region of interest from the obtained auxiliary magnetic resonance data and determine the motion state information of the region of interest of the target object according to the data of the region of interest, so as to obtain the motion state of the region of interest.

The acquired magnetic resonance signals (i.e., auxiliary magnetic resonance data) may usually include the signals of the region of interest and the region of non-interest, and the signal(s) of the region of non-interest may interfere with the judgment of the motion state of the region of interest. In some embodiments, the processing device 120 may obtain processed magnetic resonance data by preprocessing, based on the one or more target readout directions, the auxiliary magnetic resonance data. Specifically, the processing device 120 may determine interference signal(s) in the magnetic resonance signals (i.e., auxiliary magnetic resonance data) excited by the target object according to the physical position of the region of non-interest and perform truncation processing on the magnetic resonance signals according to the interference signal(s).

In some embodiments, the processing device 120 may determine the physical position of the region of non-interest, determine distribution information of the region of non-interest/region of interest of the target object along the target readout direction in the magnetic resonance data according to the excitation slice direction of the imaging sub-sequence(s) and the excitation slice direction of the slice selection gradient pulse(s), and determine the magnetic resonance signal(s) of the region of interest from the auxiliary magnetic resonance data based on the distribution information, so as to obtain the processed auxiliary magnetic resonance data.

In some embodiments, the processing device 120 may obtain the region of non-interest through a scout view, an external camera, a sensor, etc., and determine the physical position of the region of non-interest through feature extraction, deep learning, etc.

In some embodiments, the processed magnetic resonance data may include magnetic resonance data excluding data of at least part of a region of non-interest.

Figure 14:
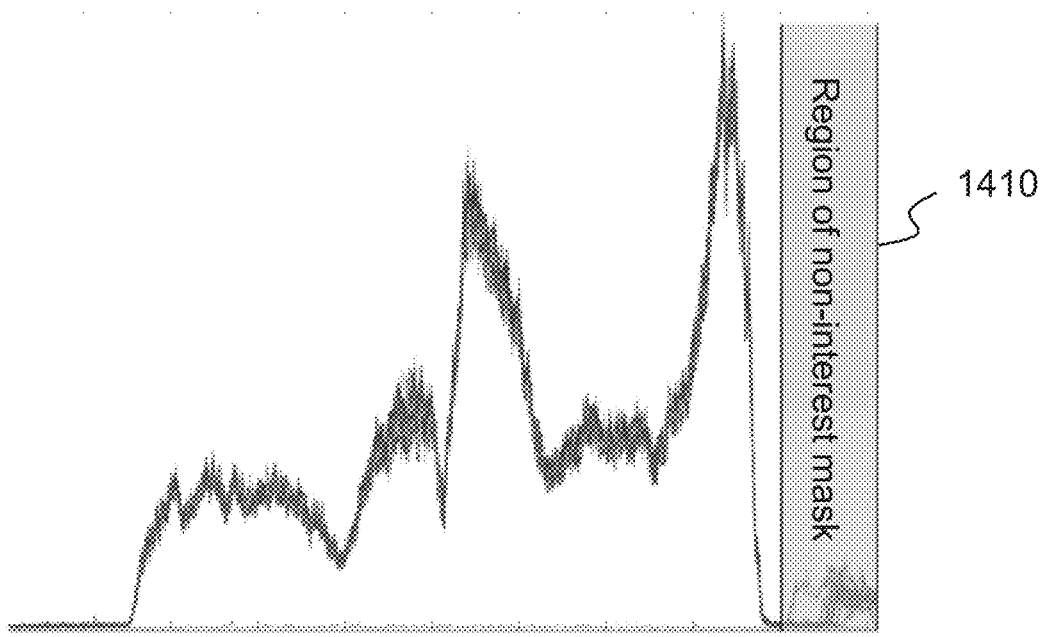
FIG. 14 is a schematic diagram illustrating auxiliary magnetic resonance data according to some embodiments of the present disclosure.

In some embodiments, the processing device 120 may determine first distribution information of the region of non-interest (i.e., a distribution range of the region of non-interest) of the target object along the target readout direction in the magnetic resonance data. The processing device 120 may remove, based on the first distribution information, the magnetic resonance signal(s) of the region of non-interest from the auxiliary magnetic resonance data in various ways (for example, truncation processing may be performed on the magnetic resonance data) and use data after removing as the processed magnetic resonance data. Since the signal(s) of the region of non-interest is usually located at an edge, in some embodiments, the processing device 120 may determine a first peak of a magnetic resonance signal from two sides to a middle direction as the signal of the region of non-interest, determine a region of non-interest mask based on the peak, and determine a signal in a region of the mask as the signal of the region of non-interest and remove the signal. For example, as shown in FIG. 14, the region of non-interest mask 1410 may be determined based on the first peak on the right side of the magnetic resonance signal.

In some embodiments, the processing device 120 may determine second distribution information (i.e., a distribution range of the region of interest) of the region of interest of the target object along the target readout direction in the magnetic resonance data. The processing device 120 may screen, based on the second distribution information, the magnetic resonance signal(s) of the region of interest from the auxiliary magnetic resonance data in various ways (e.g., mask, etc.) and use data after screening as the processed auxiliary magnetic resonance data. The first distribution information and the second distribution information may differ in that the target slices and the target readout directions of the auxiliary sequences are different.

In some embodiments, after determining the distribution range of the region of interest, the processing device 120 may obtain a boundary range of the magnetic resonance signal(s) using a boundary extraction algorithm and may further determine a non-boundary range by removing the boundary range.

In some embodiments, the processing device 120 may determine a first coincidence degree between the distribution range of the region of interest and the boundary range, and if the distribution range of the region of interest and the boundary range completely coincide or the first coincidence degree is greater than a threshold (e.g., 90%), which may indicate the signal overlapping problem, that is, the region of non-interest overlaps with the region of interest. Then the processing device 120 may rotate the readout direction(s) of the auxiliary sequence by a certain angle, so that signals of parts inside and outside the region of interest acquired by the auxiliary sequence may not overlap along the readout direction after rotation. A size of the rotation angle may be positively correlated with the coincidence degree.

In some embodiments, the processing device 120 may determine a second coincidence degree between the distribution range of the region of interest and the non-boundary region. If the second coincidence degree does not exceed a threshold (e.g., 10%), which may indicate that there is a deviation between the signal distribution of the region of interest and an actual distribution, and the signal overlapping problem may exist. The processing device 120 may rotate the readout direction(s) of the auxiliary sequence by a certain angle, so that signals of parts inside and outside the region of interest acquired by the auxiliary sequence may not overlap along the readout direction after rotation. The rotation angle may be negatively correlated with the coincidence degree.

In some embodiments, after determining the position of the region of non-interest, the processing device 120 may determine a position where the auxiliary sequence is applied according to the physical position of the region of non-interest, so as to avoid the region of non-interest, and thus, there may be no need to perform truncation processing on the auxiliary magnetic resonance data.

In some embodiments, the processing device 120 may determine the motion state information of the region of interest based on partial data related to a target feature in the auxiliary magnetic resonance data. More descriptions regarding how to determine the motion state information of the region of interest based on the partial data related to the target feature may be found in relevant descriptions in FIG. 4, which will not be repeated herein.

In some embodiments, the processing device 120 may determine reference data and target data from the auxiliary magnetic resonance data and determine the motion state information of the region of interest based on a difference between the reference data and the target data. More descriptions regarding how to determine the motion state information of the region of interest based on the difference between the reference data and the target data may be found in the relevant descriptions in FIG. 5, which will not be repeated herein.

In the process of determining the motion state of the region of interest, a motion of a part of non-interested may affect the judgment of the motion state. Taking a swallowing motion of the head as an example, the swallowing motion may occasionally occur in the scanning process. However, in general, the region of interest to be scanned may be in the brain, and the swallowing motion may not need to be reflected in the motion state during the motion detection.

In some embodiments, the processing device 120 may obtain data related to a plurality of directions of the region of interest from the auxiliary magnetic resonance data and determine the motion state information (e.g., the motion state information of the head, etc.) of the region of interest according to the data. More descriptions regarding how to determine the motion state information of the region of interest according to data related to the plurality of directions of the region of interest may be found in the relevant descriptions in FIG. 6, which will not be repeated herein.

An involuntary motion may also affect the judgment of the motion state of the region of interest. Taking peristalsis of the abdomen or pelvis as an example, the motion may often be not controlled by the scanned object and may be common in the scanning process. If the motion state is reflected, it may be prompted frequently that the scanned object moves. In addition, even if the motion state is reflected, it may be difficult to interact with the scanned object and make the scanned object cooperate for the scanning. Therefore, for these cases of involuntary motions, it may be necessary to avoid the influence and retain a real motion state.

In some embodiments, the processing device 120 may determine the motion state information of the region of interest (e.g., motion state information of the abdomen, pelvis, etc.) based on boundary data in the auxiliary magnetic resonance data. More descriptions regarding how to determine the motion state information of the region of interest based on the boundary data may be found in the relevant descriptions in FIG. 7, which will not be repeated herein.

Figure 4:
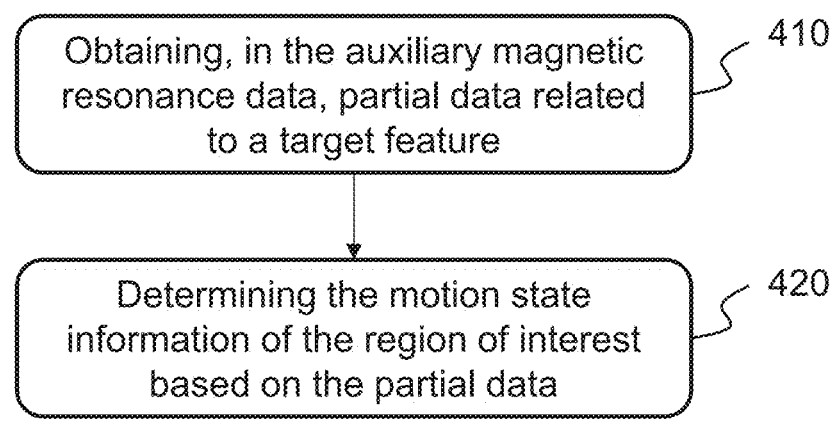
FIG. 4 is a flowchart illustrating an exemplary process for motion detection in magnetic resonance imaging according to some embodiments of the present disclosure.
Figure 5:
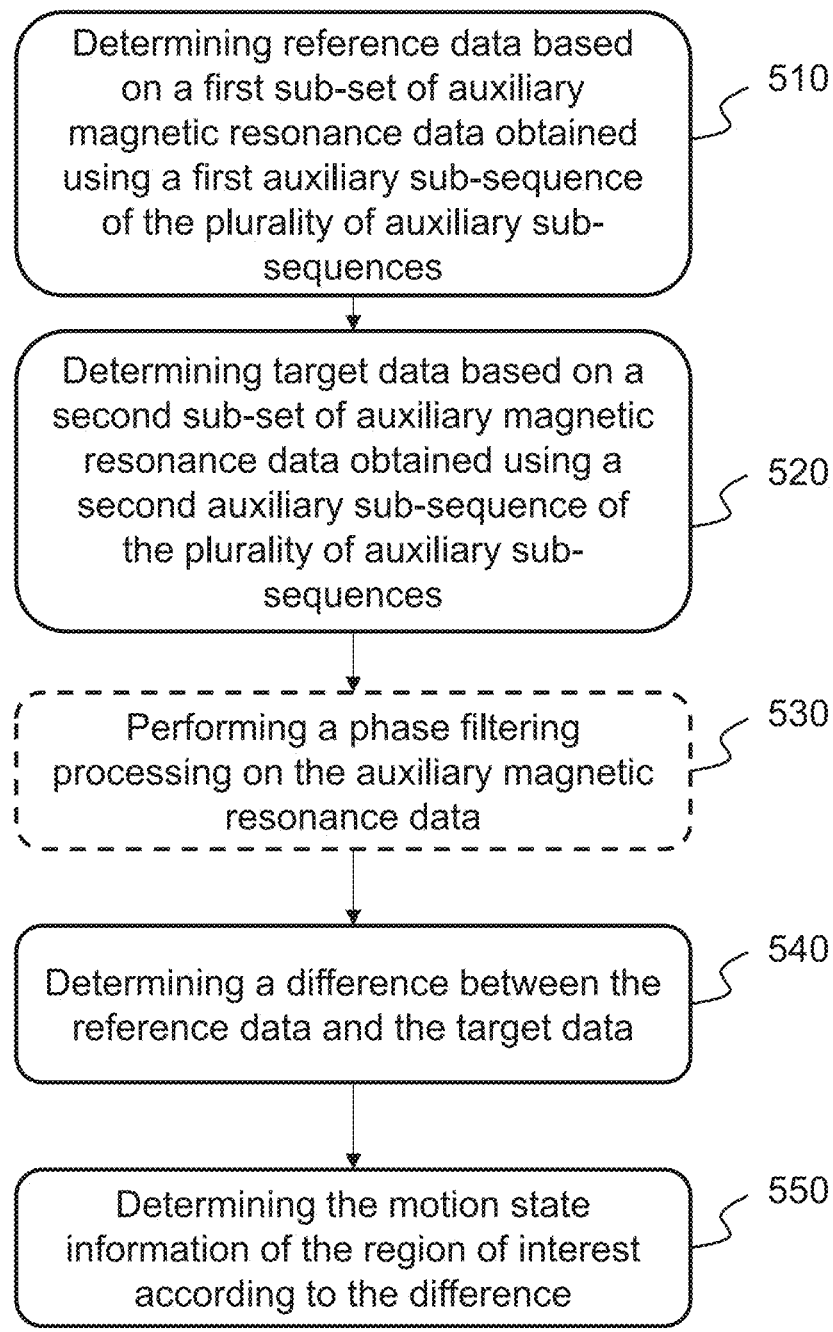
FIG. 5 is a flowchart illustrating an exemplary process for motion detection in magnetic resonance imaging according to some embodiments of the present disclosure.
Figure 7:
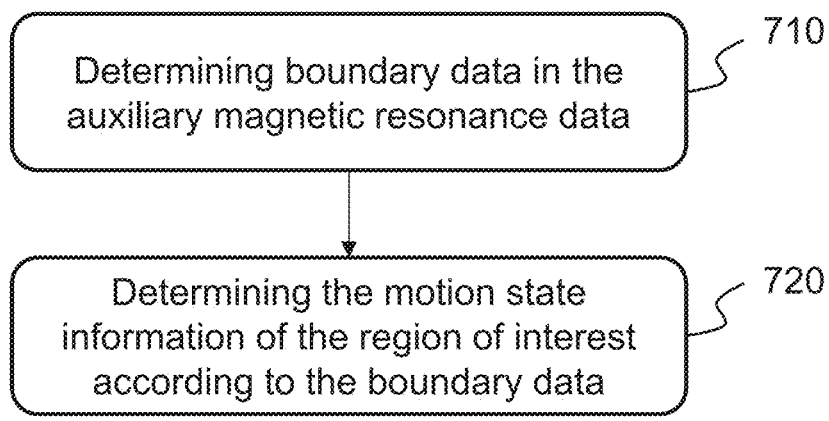
FIG. 7 is a flowchart illustrating an exemplary process for motion detection in magnetic resonance imaging according to some embodiments of the present disclosure.

In some embodiments, the processing device 120 may determine the motion state information of the region of interest of the target object by combining any of the data preprocessing, the methods shown in FIG. 4, FIG. 5, FIG. 6 and/or FIG. 7 based on the auxiliary magnetic resonance data.

If the imaging part is a part with a large difference in local motion states such as the neck, chest, abdomen, etc., the excitation slice(s) of the auxiliary sequence may need to be within the imaging region of interest. In some embodiments, if all the excitation slices (i.e., target slices) of the auxiliary sequence are within the region of interest, the processing device 120 may determine the motion state information of the region of interest of the target object by performing processing as shown in processes 400, 500, and/or 700 on the preprocessed auxiliary magnetic resonance data.

If the imaging part is the head, legs, etc., where only approximately rigid body motion can occur, the excitation slice(s) of the auxiliary sequence may be selected not only in the imaging region of interest, but also in the adjacent slice(s) outside the imaging region of interest. In some embodiments, if one or more excitation slices of the auxiliary sequence are outside the region of interest, the processing device 120 may determine the motion state information of the region of interest of the target object by performing the processing as shown in the operation 530, the process 400 and/or the process 600 on the auxiliary magnetic resonance data.

In some embodiments, the processing device 120 may determine the motion state information of the region of interest of the target object based on the auxiliary magnetic resonance data in other ways, for example, through a machine learning model, etc.

In some embodiments of the present disclosure, the magnetic resonance signal(s) for motion detection may be obtained in real time using the auxiliary sequence inserted in the imaging sub-sequence(s) and the motion state information of the scanned object may be obtained by performing different processing based on the obtained signal(s) and motion state features of different parts. Therefore, the motion state of the scanned person can be more accurately and better reflected.

In some embodiments, after the operation 320, that is, after determining the motion state information of the region of interest of the target object, optionally, the processing device 120 may perform the magnetic resonance imaging process on the region of interest of the target object by performing the operation 330 (e.g., by performing imaging scanning related to the imaging sub-sequence(s)), so as to obtain magnetic resonance imaging data of the region of interest of the target object. In some embodiments, through execution of the operations 310-330, the magnetic resonance scanning of the target object may be completed.

In 330, the processing device 120 may obtain magnetic resonance imaging data of the region of interest of the target object by controlling, based on the motion state information of the region of interest, an imaging scan related to the at least two imaging sub-sequences performed on the target object. In some embodiments, the operation 330 may be performed by the imaging module 230.

In some embodiments, after obtaining the motion state information of the region of interest, the processing device 120 may continue to perform the magnetic resonance imaging process on the region of interest of the target object by performing imaging scanning related to the at least two imaging sub-sequences according to the motion state information of the region of interest and use the obtained data as the magnetic resonance imaging data of the region of interest of the target object.

In some embodiments, the processing device 120 may determine whether the scanned object is in motion according to the obtained motion state information, terminate the scanning in advance in response to a large motion, or remove the data of the motion, and perform supplementary acquisition and reacquisition of the data affected by the motion to obtain a rectified image, e.g., a magnetic resonance image.

In some embodiments, after obtaining the magnetic resonance imaging data of the region of interest of the target object, the processing device 120 may perform image reconstruction based on the magnetic resonance imaging data to obtain a reconstructed image of the region of interest of the target object.

In some embodiments, after determining the motion state information of the region of interest of the target object, the processing device 120 may perform motion offset correction on the magnetic resonance imaging data obtained by the imaging sub-sequence(s) according to the motion state information of the region of interest and use the corrected data as the magnetic resonance imaging data of the region of interest of the target object.

In some embodiments, if the target object undergoes a rigid motion, the processing device 120 may obtain estimated motion offsets in a plurality of target readout directions based on the auxiliary magnetic resonance data of the target object; and synthesize the estimated motion offset in each readout direction as vector(s) to obtain the motion offset and/or motion direction of the target object. A readout signal resolution of the auxiliary sub-sequence may be taken as a minimum identifiable offset. The motion offset and/or motion direction may have a time attribute, i.e., the motion offset and/or motion direction may correspond to a moment of each auxiliary sub-sequence.

In some embodiments, the processing device 120 may obtain the estimated motion offset(s) in the target readout direction(s) by: performing a Fourier inverse transform on the one-dimensional signal(s) acquired by the auxiliary sub-sequence(s) (i.e., the auxiliary magnetic resonance data); translating the signal(s) to both sides along the readout direction by one or more units sequentially in the form of enumeration with the minimum identifiable offset as a unit; calculating a difference between translated signal(s) and reference signal(s) (i.e., the inversely transformed signal(s)), respectively, and determining a F-norm of the difference; and using a translation corresponding to a smallest F-norm as the estimated motion offset(s) of the target object in the target readout direction of the auxiliary sub-sequence(s). In some embodiments, the F-norm of the difference between the translated signal(s) and the reference signal(s) may be calculated by the following equation:

$$\|S-S_f\|_F = \sqrt{\Sigma(Re(S_i-S_{f_i})^2 + (Im(S_i-S_{f_i})^2} \quad (1)$$

where S denotes the translated signal; $S_f$ denotes a signal before translation, i.e., the reference signal; I denotes a serial number of a signal sampling point, $S_i$ denotes a translated signal of the $i^{th}$ signal sampling point, $S_{f_i}$ denotes a signal before translation of the $i^{th}$ signal sampling point; Re denotes a real part of a complex number, Im denotes an imaginary part of the complex number; and $\|S-S_f\|_F$ denotes calculating the F-norm of $S-S_f$.

In some embodiments, for the general fast spin echo imaging sequence and the gradient echo imaging sequence, the processing device 120 may perform motion offset correction in the following ways. A time-varying curve may be generated according to the estimated motion offset(s), and positions of the signals acquired by the imaging sub-sequences corresponding to the auxiliary sub-sequences in K-space may be recorded. Taking the estimated motion offset corresponding to a signal in a central region of the K-space as a standard, if a difference between the estimated motion offsets corresponding to signals in other regions of the K-space and the standard exceeds a certain threshold, the system may re-acquire K-space data.

In some embodiments, for the general echo planar imaging sequence, since each slice of the reconstructed image in the echo planar imaging sequence corresponds to a motion offset in a corresponding plane (regardless of a motion in an inter-slice direction), the processing device 120 may translate each pixel of the reconstructed image according to the motion offset to perform motion offset correction.

In some embodiments of the present disclosure, motion offset correction may be performed on the magnetic resonance signal(s) of the target object based on the obtained motion state information and image reconstruction may be performed, which can effectively eliminate or reduce artifacts in the magnetic resonance image, thereby improving clarity of the magnetic resonance image.

FIG. 4 is a flowchart illustrating an exemplary process of for motion detection in magnetic resonance imaging according to some embodiments of the present disclosure.

In some embodiments, one or more operations of the process 400 shown in FIG. 4 may be implemented by the system 100 shown in FIG. 1. For example, the process 400 shown in FIG. 4 may be stored in a storage medium of the processing device 120 in the form of instructions and called and/or executed by a processing device (e.g., the processing device 120). For the purpose of illustration, the execution of the process 400 is described below by taking the processing device 120 as an example.

As shown in FIG. 4, the process 400 may include one or more of the following operations. In some embodiments, the process 400 may be executed by the processing device 120 or the motion state determination module 220. In some embodiments, the processing device 120 may obtain auxiliary magnetic resonance data in various feasible implementation ways (for example, the processing device 120 may obtain the auxiliary magnetic resonance data in various ways described in operation 310 in FIG. 3), and the processing device 120 may determine the motion state information of the region of interest of the target object based on the auxiliary magnetic resonance data by executing the operation(s) shown in the process 400 after obtaining the auxiliary magnetic resonance data.

In 410, the processing device 120 may obtain, in the auxiliary magnetic resonance data, partial data related to a target feature.

The target feature may also be referred to as a motion feature, which refers to feature information that can effectively reflect a motion state of a region of interest of a target object, e.g., a motion offset, etc. Considering the problem of pulse stability, the auxiliary magnetic resonance data acquired using the auxiliary sub-sequence(s) may not be completely reliable, therefore, in some embodiments, the processing device 120 may extract a useful feature that can reflect the motion state of the target object from the partial data (e.g., the echo signal(s)) related to the target feature in the auxiliary magnetic resonance data in various ways (e.g., through an edge detection algorithm, etc.)

In some embodiments, the processing device 120 may extract the partial data (e.g., data relating to a feature region of motion detection, etc.) related to the target feature from the auxiliary magnetic resonance data based on the edge detection algorithm.

Figure 16:
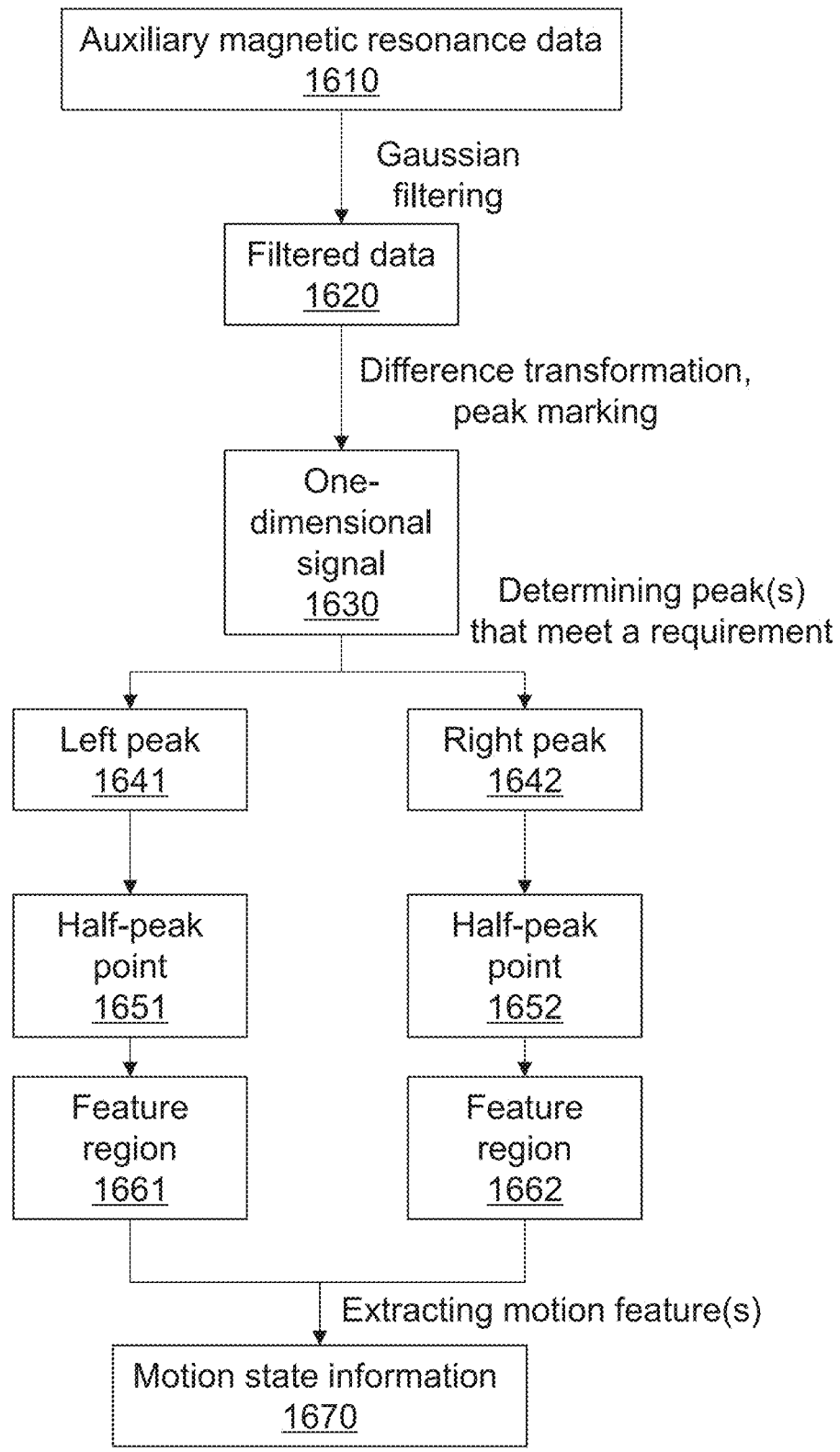
FIG. 16 is a schematic diagram illustrating a process for motion detection in magnetic resonance imaging according to some embodiments of the present disclosure.

Merely by way of example, as shown in FIG. 16, the processing device 120 may perform Gaussian filtering on the auxiliary magnetic resonance data 1610 to obtain filtered data 1620. The auxiliary magnetic resonance data 1610 and the filtered data 1620 may be data of one-dimensional echo signal(s). The processing device 120 may determine a maximum signal value of the filtered data 1620. The processing device 120 may perform a difference transformation on the filtered data 1620 and mark, from left to right, all points where differential value(s) change from positive to negative as peaks, thereby obtaining a one-dimensional signal 1630. The processing device 120 may determine, from these peaks, one or more peaks that meet a requirement (e.g., the left peak 1641 and the right peak 1642). Specifically, the processing device 120 may determine a first peak greater than a maximum preset threshold (e.g., 20%) from the left and right sides, respectively. The processing device 120 may determine a half-peak point 1651 (the amplitude of which is a half of that of the left peak 1641) on the left side of the left peak 1641 and determine a half-peak point 1652 (the amplitude of which is a half of that of the left peak 1641) on the right side of the left peak 1641. The processing device 120 may use certain ranges on both sides of the left and right half-peak points (e.g., the half-peak point 1651 and the half-peak point 1652) as feature regions for motion detection, i.e., the feature region 1661 and the feature region 1662, so as to extract the motion state information 1670 from the feature region 1661 and the feature region 1662.

Figure 15:
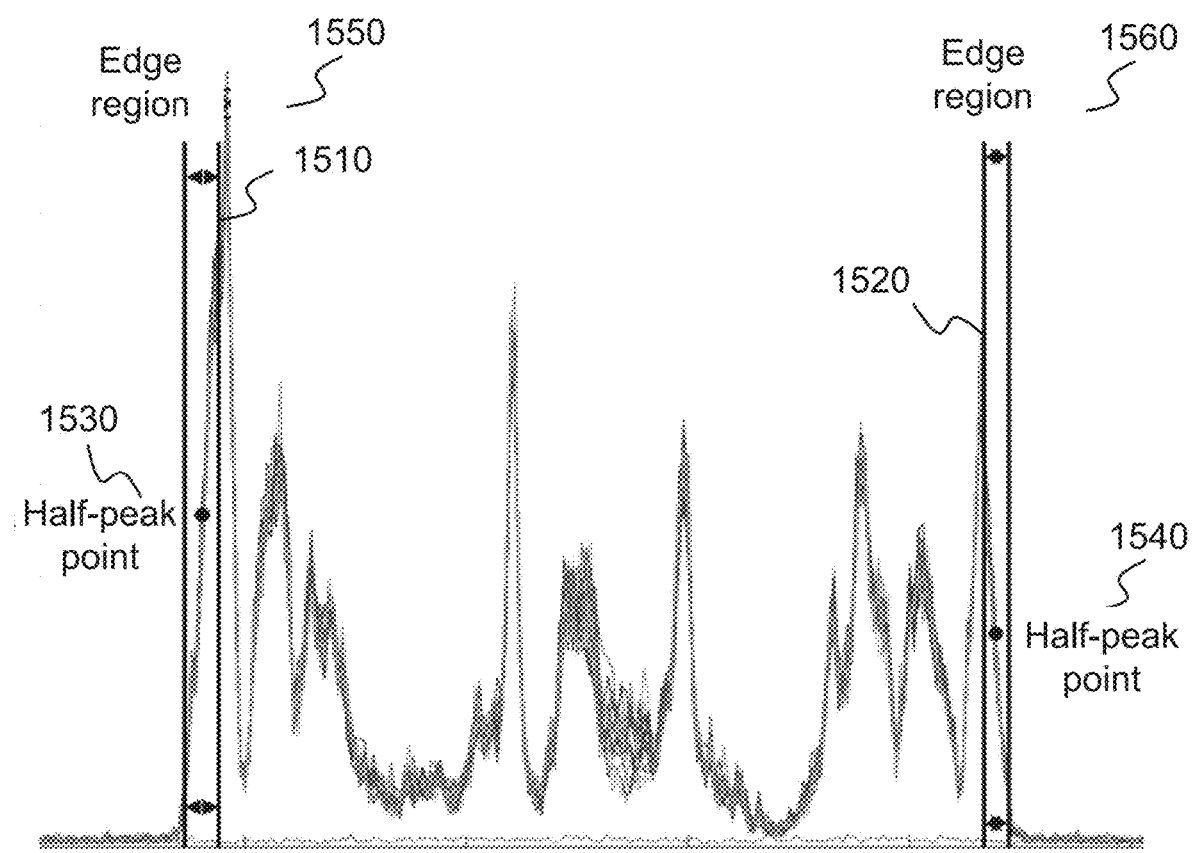
FIG. 15 is a schematic diagram illustrating auxiliary magnetic resonance data according to some embodiments of the present disclosure.

As another example, the one-dimensional signal shown in FIG. 15 may be the one-dimensional signal obtained after difference transformation of the one-dimensional echo signal, which may be equivalent to the one-dimensional signal 1630 in FIG. 16. The one-dimensional signal has the left peak 1510 and the right peak 1520. The half-peak points 1530 and 1540 are the left half-peak point and the right half-peak point, respectively, and the edge regions 1550 and 1560 are determined feature regions for motion detection.

In 420, the processing device 120 may determine the motion state information of the region of interest based on the partial data.

In some embodiments, after obtaining the partial data related to the target feature, the processing device 120 may determine the target feature from the partial data and determine the motion state information of the region of interest based on the target feature. For example, as shown in FIG. 15, the target feature may be features of half-peak points 1530 and 1540, which may be respectively located on a leftmost rising edge and a rightmost falling edge of the one-dimensional echo signal in the figure.

In some embodiments, the processing device 120 may determine the motion state information of the region of interest based on the partial data related to the target feature in various ways, for example, through any one of the processes 500, 600, and 700.

In some embodiments of the present disclosure, the data related to the target feature characterizing the motion state of the target object may be obtained, and the motion state information of the region of interest may be determined based on the data, so that the data can be processed in a more targeted manner, thereby improving the robustness of the system and improving the accuracy and stability of motion detection.

FIG. 5 is a flowchart illustrating an exemplary process of for motion detection in magnetic resonance imaging according to some embodiments of the present disclosure.

In some embodiments, one or more operations of the process 500 shown in FIG. 5 may be implemented by the system 100 shown in FIG. 1. For example, the process 500 shown in FIG. 5 may be stored in a storage medium of the processing device 120 in the form of instructions and called and/or executed by a processing device (e.g., the processing device 120). For the purpose of illustration, the execution of the process 500 is described below by taking the processing device 120 as an example.

As shown in FIG. 5, the process 500 may include one or more of the following operations. In some embodiments, the process 500 may be executed by the processing device 120 or the motion state determination module 220. In some embodiments, the processing device 120 may obtain auxiliary magnetic resonance data in various feasible implementation ways (for example, the processing device 120 may obtain the auxiliary magnetic resonance data in various ways described in the operation 310 in FIG. 3), and the processing device 120 may determine the motion state information of the region of interest of the target object based on the auxiliary magnetic resonance data by executing the operation(s) shown in the process 500 after obtaining the auxiliary magnetic resonance data.

In 510, the processing device 120 may determine reference data based on a first sub-set of auxiliary magnetic resonance data obtained using a first auxiliary sub-sequence of the plurality of auxiliary sub-sequences.

The reference data refers to auxiliary magnetic resonance data (i.e., motion detection data) used as a reference, and may be obtained before target data is obtained. The target data may be the auxiliary magnetic resonance data obtained at a current time (latest) used as a target. In some embodiments, the reference data may include a sub-set of data obtained by one or more auxiliary sub-sequences. In some embodiments, the reference data may include an average of a plurality of sub-sets of data, i.e., an average of data obtained by the plurality of auxiliary sub-sequences. In some embodiments, the reference data may be other forms of data.

Figure 17:
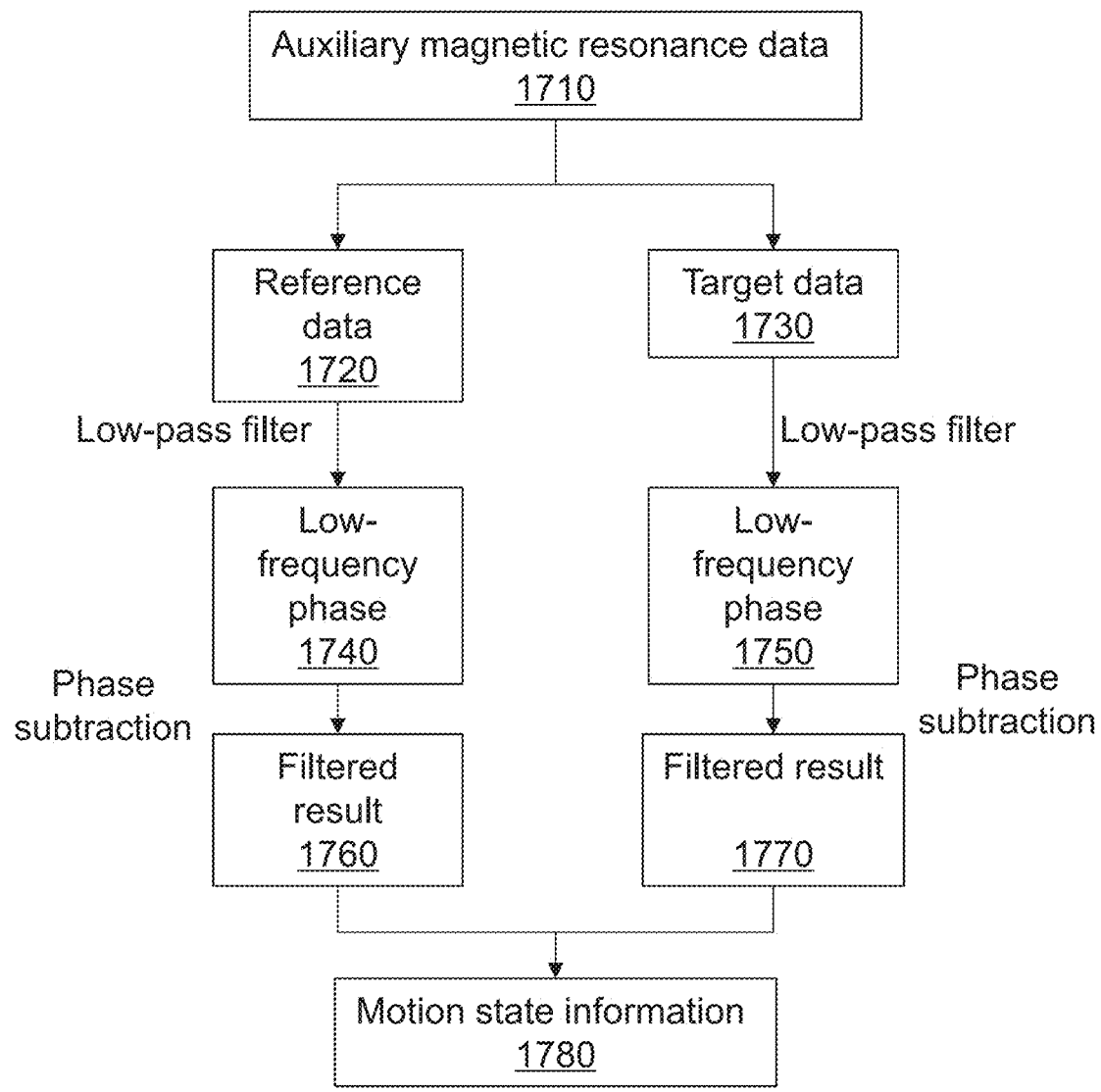
FIG. 17 is a schematic diagram illustrating a process for motion detection in magnetic resonance imaging according to some embodiments of the present disclosure.

In some embodiments, the processing device 120 may determine the reference data from the auxiliary magnetic resonance data obtained by the auxiliary sub-sequences. For example, the reference data 1720 may be obtained from the auxiliary magnetic resonance data 1710 as shown in FIG. 17. In some embodiments, the one or more auxiliary sub-sequences before the latest (current) auxiliary sub-sequence may be selected as the first auxiliary sub-sequence of the plurality of auxiliary sub-sequences, and the reference data may be determined based on the data obtained using the first auxiliary sub-sequence.

In some embodiments, the processing device 120 may select an auxiliary sub-sequence before the latest auxiliary sub-sequence as the first auxiliary sub-sequence and use the data obtained by the auxiliary sub-sequence as the reference data. For example, assuming that the auxiliary sub-sequences (i.e., $S_1, S_2, S_3, \ldots, S_d$) are arranged successively in time (e.g., the auxiliary magnetic resonance data 1710), the latest (current) auxiliary sub-sequence may be $S_d$, any one of $S_1$ to $S_{d-1}$ may be selected as the first auxiliary sub-sequence, and the reference data may be the data obtained using the selected first auxiliary sub-sequence.

In some embodiments, the processing device 120 may select a plurality of auxiliary sub-sequences before the latest auxiliary sub-sequence and determine an average of data obtained by the auxiliary sub-sequences as the reference data. For example, auxiliary sub-sequences with a count of c ($1 \leq c \leq d-1$) may be selected from the auxiliary sub-sequences (i.e., $S_1, S_2, S_3, \ldots, S_d$) in the previous example as the first auxiliary sub-sequence, and the average of data obtained using the c auxiliary sub-sequences may be averaged as the reference data. c and d may be natural numbers.

In 520, the processing device 120 may determine target data based on a second sub-set of auxiliary magnetic resonance data obtained using a second auxiliary sub-sequence of the plurality of auxiliary sub-sequences.

In some embodiments, the processing device 120 may determine the target data from the auxiliary magnetic resonance data obtained using the auxiliary sub-sequence. For example, as shown in FIG. 17, the target data 1730 may be obtained from the auxiliary magnetic resonance data 1710. In some embodiments, a latest auxiliary sub-sequence may be selected as the second auxiliary sub-sequence of the plurality of auxiliary sub-sequences, and data obtained using the auxiliary sub-sequence may be used as the target data. For example, $S_d$ may be selected from auxiliary sub-sequences (i.e., $S_1, S_2, S_3, \ldots, S_d$) (e.g., the auxiliary magnetic resonance data 1710) as the second auxiliary sub-sequence, and the data obtained by $S_d$ may be used as the target data.

In some embodiments, after obtaining the auxiliary magnetic resonance data (i.e., the reference data, the target data) through the operations 510 and 520, the processing device 120 may perform a phase filtering processing on the auxiliary magnetic resonance data through the operation 530 and use the filtered data as the auxiliary magnetic resonance data. In some embodiments, the processing device 120 may omit the operation 530 and directly execute the operation 540 after the operations 510 and 520.

In 530, the processing device 120 may perform a phase filtering processing on the auxiliary magnetic resonance data.

In the process of obtaining the auxiliary magnetic resonance data, due to various factors such as field drift, temperature rise, etc., there may be a phase error of the obtained magnetic resonance signals (even if the scanned object does not move). Therefore, in some embodiments, the phase filtering processing may be performed on the auxiliary magnetic resonance data first, and a motion state may be determined. The phase filtering process may be used to reduce or eliminate the phase error of the auxiliary magnetic resonance data. For example, as shown in FIG. 17, for the reference data 1720 and the target data 1730, a low-frequency phase 1740 corresponding to the reference data 1720 and a low-frequency phase 1750 corresponding to the target data 1730 may be obtained through a low-pass filter. Further, the amplitude of the data may be kept unchanged, and the phase may be subtracted, i.e., the phase of the reference data 1720 subtracted from the low-frequency phase 1740 may be used as the phase (i.e., a filtered result 1760) of the reference data 1720, the phase of the target data 1730 subtracted from the low-frequency phase 1750 may be used as the phase (i.e., a filtered result 1770) of the target data 1730, and the filtered result 1760 and the filtered result 1770 may be used for calculation, thereby obtaining the motion state information 1780.

Merely by way of example, for the motion detection data X(m, n) (e.g., the reference data or the target data) obtained in K-space, where m denotes a count of sampling points and n denotes a count of channels, the low-pass filter V(m, 1) may be used in a frequency domain to multiply by the data X according to the channel to obtain the filtered data Z (low-frequency phase), and an inverse Fourier transform may be performed on the filtered data X and the filtered data Z to obtain data x(m, n) (referred to as x) in an image domain and z(m, n) (referred to as z). For data x(m, n), if calculated by channel, the amplitude of the data is kept unchanged and the phase becomes a phase difference between the phase of x and the phase of z, the filtered result x'(m,n) of x(m,n) may be determined based on the following equation:

$$x'(m,n) = |A| * \exp(i*\theta) \quad (2)$$

where A denotes the magnitude of x(m,n); i denotes an imaginary unit; and θ denotes the phase, and θ may be determined based on the following equation:

$$\theta = \text{angle}(x) - \text{angle}(z) \quad (3)$$

where angle(x) and angle(z) denotes the phases of data x and z, respectively.

In some embodiments of the present disclosure, the phase filtering processing may be performed on the obtained auxiliary magnetic resonance data, which can reduce and eliminate the phase error of the magnetic resonance signals caused by various factors such as field drift, temperature rise, etc., remove the influence of the additional factors, improve the accuracy and reliability of the auxiliary magnetic resonance data, thereby improving the accuracy of the obtained motion state.

In 540, the processing device 120 may determine a difference between the reference data and the target data.

In some embodiments, after obtaining the reference data and the target data, the processing device 120 may determine the difference between the reference data and the target data. In some embodiments, the processing device 120 may determine the difference between the reference data and the target data in various ways, for example, by performing correlation calculation, etc.

In some embodiments, if the reference data is data of a data acquisition point (i.e., the auxiliary sub-sequence), the correlation between the reference data and the target data may be calculated based on the following equation:

$$r = \frac{\sum_{i=1}^{n}(U_i - \overline{U})(Y_i - \overline{Y})}{\sqrt{\sum_{i=1}^{n}(U_i - \overline{U})^2}\sqrt{\sum_{i=1}^{n}(Y_i - \overline{Y})^2}} \quad (4)$$

where r denotes the correlation between the reference data U and the target data Y; i denotes a serial number of the data acquisition point; $U_i$ refers to the data of one data acquisition point in the reference data U, and $\overline{U}$ refers to an average of the data of all data acquisition points in the reference data U; $Y_i$ refers to the data of one data acquisition point in the target data Y; $\overline{Y}$ refers to an average of the data of all data acquisition points in the target data Y; and n denotes a count of data acquisition points in the reference data U and/or the target data Y.

In 550, the processing device 120 may determine the motion state information of the region of interest according to the difference.

In some embodiments, the processing device 120 may determine the motion state information according to the difference between the reference data and the target data (e.g., the correlation between the reference data and the target data, etc.). The motion state information may include a motion curve, for example, a curve with the abscissa of time and the ordinate of a value of r in Equation (3).

The correlation r between the reference data and the target data may reflect the correlation between the target data and the reference data. The greater the correlation, the larger the r, and the smaller the motion amplitude. In some embodiments, the processing device 120 may directly draw a motion curve according to r or 1−r, where the abscissa is time, and the ordinate may be r or 1−r.

In some embodiments of the present disclosure, the difference between current data and previous data in the auxiliary magnetic resonance data may be obtained, the motion state may be determined according to the difference, and the data phase error caused by various uncertain factors such as field drift, temperature rise, etc. may be reduced or even eliminated by phase filtering, which can reflect the change of data in time more accurately and improve the robustness of the process, so as to obtain an accurate motion state changing with time.

In some embodiments, each time the medical imaging device 110 executes an auxiliary sub-sequence, the processing device 120 may obtain the auxiliary magnetic resonance data acquired by the current auxiliary sub-sequence from the medical imaging device 110, process the auxiliary magnetic resonance data according to the process 500, and determine the current motion state of the region of interest, thereby realizing real-time motion monitoring of the region of interest. For example, if the value of r corresponding to the current auxiliary magnetic resonance data is smaller than a motion detection threshold, which may indicate that the current scanned object has a relatively large motion amplitude, the processing device 120 may issue a prompt, automatically terminate the scan, or automatically remove the magnetic resonance signal acquired by the imaging sub-sequence before the current auxiliary sub-sequence and adjacent to the current auxiliary sub-sequence.

FIG. 6 is a flowchart illustrating an exemplary process for motion detection in magnetic resonance imaging according to some embodiments of the present disclosure.

In some embodiments, one or more operations of the process 600 shown in FIG. 6 may be implemented by the system 100 shown in FIG. 1. For example, the process 600 shown in FIG. 6 may be stored in a storage medium of the processing device 120 in the form of instructions and called and/or executed by a processing device (e.g., the processing device 120). For the purpose of illustration, the execution of the process 600 is described below by taking the processing device 120 as an example.

As shown in FIG. 6, the process 600 may include one or more of the following operations. In some embodiments, the process 600 may be executed by the processing device 120 or the motion state determination module 220. In some embodiments, the processing device 120 may obtain auxiliary magnetic resonance data in various feasible implementation ways (for example, the processing device 120 may obtain the auxiliary magnetic resonance data in various ways described in the operation 310 in FIG. 3), and the processing device 120 may determine the motion state information of the region of interest of the target object based on the auxiliary magnetic resonance data by executing the method shown in the process 600 after obtaining the auxiliary magnetic resonance data.

In some embodiments, a motion of a region of non-interest may affect a motion state of a region of interest, and an influence of an interfering motion (i.e., the motion of the region of non-interest) may need to be removed. For example, the region of interest may be a brain, and an swallowing motion may affect the motion state of the brain and may be included in the motion detection data. Therefore, the influence of the swallowing motion may need to be removed in the obtained auxiliary magnetic resonance data.

In some embodiments, it may be determined that the interfering motion (e.g., the swallowing motion, etc.) is included in the data by comparing data in different directions (e.g., two directions, three directions, etc.), and the influence of the motion may be removed by processing the data, so as to obtain the motion state information of the scanned object (i.e., the target object).

In 610, the processing device 120 may obtain, in the auxiliary magnetic resonance data, first data related to a first direction of the region of interest and second data related to a second direction of the region of interest. An influence of an interfering motion in the first direction is stronger than an influence of an interfering motion in the second direction.

In some embodiments, the data in two different directions of the region of interest (e.g., the head) in the auxiliary magnetic resonance data may be obtained. Data in one direction may be more influenced by the interfering motion than data in the other direction. For example, the first data related to the first direction of the region of interest, and the second data related to the second direction of the region of interest may be obtained, and the first data may be more influenced by the interfering motion than the second data.

Figure 18:
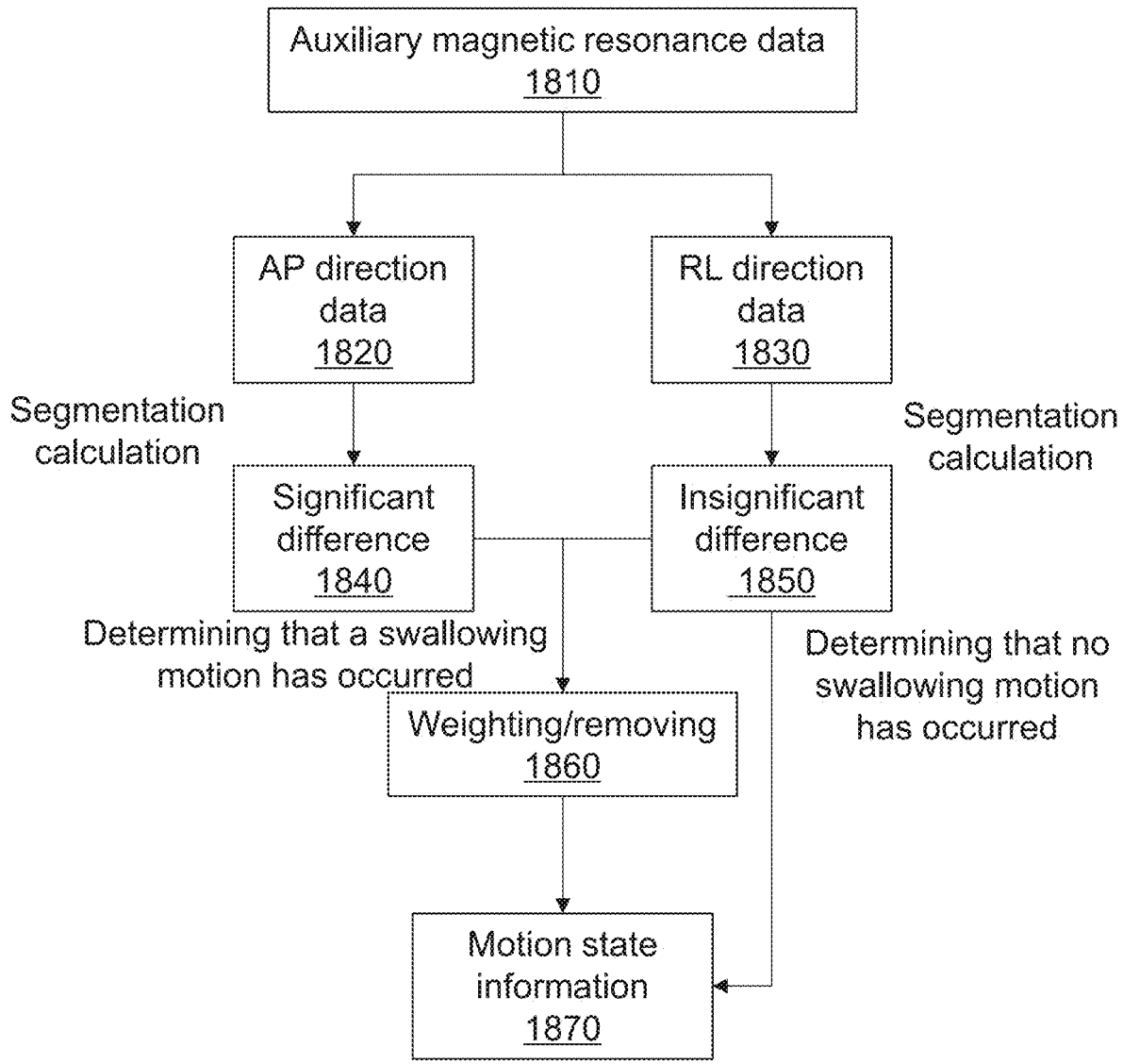
FIG. 18 is a schematic diagram illustrating a process for motion detection in magnetic resonance imaging according to some embodiments of the present disclosure.

As shown in FIG. 18, in some embodiments, AP direction data 1820 of a patient coordinate system (the scanned object may be the patient) may be obtained from the motion detection data 1810 as the first data, and RL direction data 1830 of the patient coordinate system may be obtained as the second data. The AP direction may be a direction connecting a hindbrain and forehead of the scanned object (anterior-posterior direction); the RL direction may be a left-right direction of the scanned object, and data in the AP direction may be more likely to be influenced by the head swallowing motion than data in the RL direction.

In some embodiments, at least two auxiliary sub-sequences may be inserted into each TR of the magnetic resonance scanning sequence, which may be respectively used to obtain data in different directions. In some embodiments, the AP direction data may be obtained by exciting a sagittal plane of the region of interest using the first auxiliary sub-sequence and applying a readout gradient along the AP direction. The RL direction data may be obtained by exciting a coronal plane of the region of interest using the second auxiliary sub-sequence and applying a readout gradient along the RL direction.

In 620, the processing device 120 may determine the motion state information of the region of interest according to the first data and the second data.

Taking the AP and RL directions of the patient coordinate system as an example, if a swallowing motion occurs, in the AP direction, a signal change may mainly occur in the A direction (forehead); in the RL direction, the signal change may have no obvious direction tendency. Therefore, in some embodiments, the processing device 120 may determine the motion state information of the region of interest according to the first data and the second data, for example, the processing device 120 may determine whether the swallowing motion has occurred according to the AP direction data and the RL direction data, so as to determine the motion state information of the head.

In some embodiments, the processing device 120 may calculate the data in each direction (e.g., the AP and RL directions) in segments, and determine a difference between the segmentation calculation results in each direction. If there is a significant difference in the AP direction, and there is a small difference in the RL direction, it may be determined that the swallowing motion has occurred.

The swallowing motion of the head may cause vibration in the A direction of the AP direction, but the P direction (hindbrain) may not change much, so the data in the A direction and P direction (which may be divided into two segments along the AP direction, one segment may represent the A direction data, and the other segment may represent the P direction data) may have a significant difference. However, there may be no significant difference in the influence of the swallowing motion on the data in the R (right) and L (left) directions of the RL direction (because the throat is in the middle), so there may be a relatively small difference between the R direction data and the L direction data.

In some embodiments, the processing device 120 may divide the first data into at least two first segments along the first direction; determine a first motion state of each of the at least two first segments; divide the second data into at least two second segments along the second direction; determine a second motion state of each of the at least two second segments; determine a first difference between first motion states of the at least two first segments; determine a second difference between second motion states of the at least two second segments; and determine whether the auxiliary magnetic resonance data is affected by the interfering motion according to the first difference and the second difference. If the first difference is significant and the second difference is insignificant, the processing may determine that the auxiliary magnetic resonance data is influenced by the interfering motion, otherwise the processing device may determine the auxiliary magnetic resonance data is not influenced by the interfering motion. For example, the magnetic resonance signal X in the AP direction may be divided into two segments along the AP direction according to a physical position, the magnetic resonance signal Y in the RL direction may be divided into two segments along the RL direction according to the physical position (may be divided equally or based on a specific scanning part), the motion state of each segment may be calculated separately (for example, the data corresponding to each segment may be obtained in the parameter data by the operation(s) shown in FIG. 5), the motion results X1 and X2 in the AP direction (e.g., the value of r in equation (4)) and the motion results Y1 and Y2 in the RL direction (e.g., the value of r in equation (4)) may be obtained, and the calculation results of X1, X2 and Y1, Y2, may be respectively compared. If there is a significant difference in the AP direction and no significant difference in the RL direction, i.e., if there is a significant difference between X1 and X2, but there is no significant difference between Y1 and Y2, it may be determined that the swallowing motion has occurred.

In some embodiments, whether there is a significant difference may be determined based on whether a ratio or difference of the motion results of the different segments reaches a preset threshold. For example, assuming that the motion results X1 and X2 in the AP direction are values of the correlation r in equation (4), and X1 is greater than X2, if the ratio or difference between X1 and X2 is greater than or equal to the preset threshold, it may be determined that there is a significant difference between X1 and X2.

As shown in FIG. 18, in some embodiments, the AP direction data 1820 may be calculated in segments, and the segmentation calculation results of the AP direction may be compared to obtain a determination result 1840 (e.g., the difference is significant), and at the same time, the RL direction data 1830 may be calculated in segments, and the segmentation calculation results of the RL direction may be compared to obtain a determination result 1850 (e.g., the difference is insignificant), so that it may be determined that the swallowing motion has occurred based on the determination results 1840 and 1850. If the comparison of the segmentation calculation results of the AP direction and the RL direction shows the insignificant difference (e.g., the determination result 1850), it may be determined that no swallowing motion has occurred.

In some embodiments, if it is determined that there is the interfering motion, that is, the auxiliary magnetic resonance data is influenced by the interfering motion, the data may be processed in various ways (for example, weighting calculation of data in different directions, removing data in influenced directions, etc.), to eliminate the influence of interfering motion, so as to obtain the motion state information of the region of interest based on the processed data.

As shown in FIG. 18, in some embodiments, after it is determined that the swallowing motion has occurred, the AP direction data 1820 and the RL direction data 1830 may be weighted/removed by the operation 1860, and the motion state information 1870 may be obtained based on the processed data.

In some embodiments, in response to determining that the auxiliary magnetic resonance data is affected by the interfering motion, i.e., the first difference is a significant difference and the second difference is not a significant difference, a first weight of the first data and a second weight of the second data may be set. The first weight may be smaller than the second weight. The motion state may be determined according to the first weight and the second weight. For example, for the motion results X1 and X2 of the AP direction and Y1 and Y2 of the RL direction, X1 and X2 may be combined into one value X' (e.g., by taking an average, etc.), Y1 and Y2 may be combined into one value Y' (e.g., by taking an average, etc.), weighted summation may be performed on X' and Y', and a result of the weighted summation may be used as the data for determining the motion state information. The weight of X' may be smaller than the weight of Y', i.e., the weight of the AP direction may be smaller than the weight of the RL direction, thereby reducing the influence of the AP direction data. As another example, the values of r may be calculated respectively according to the AP direction data and the RL direction data by the operation(s) shown in FIG. 5, which may be recorded as rAP and rRL, the weights wAP and wRL may be set for rAP and rRL, respectively, the rAP and rRL may be weighted and summed, and the result of weighted summation may be used as the data for determining the motion state information. wAP may be smaller than wRL.

In some embodiments, in response to determining that the auxiliary magnetic resonance data is affected by the interfering motion, i.e., the first difference is a significant difference and the second difference is an insignificant difference, the first data may be removed, and the motion state information (e.g., the schematic diagram of the motion state shown in FIG. 19) may be determined according to the second data. For example, for the motion results X1 and X2 of the AP direction and the motion results Y1 and Y2 of the RL direction, X1 and X2 may be removed, Y1 and Y2 may be combined into a value Y' in a way such as averaging, and Y' may be used as the data for determining the motion state information. As another example, the data in the AP direction may be directly removed, the value of r may be calculated merely according to the RL direction data by the operation(s) shown in FIG. 4, and a motion curve may be generated based on the value of r.

Figure 19:
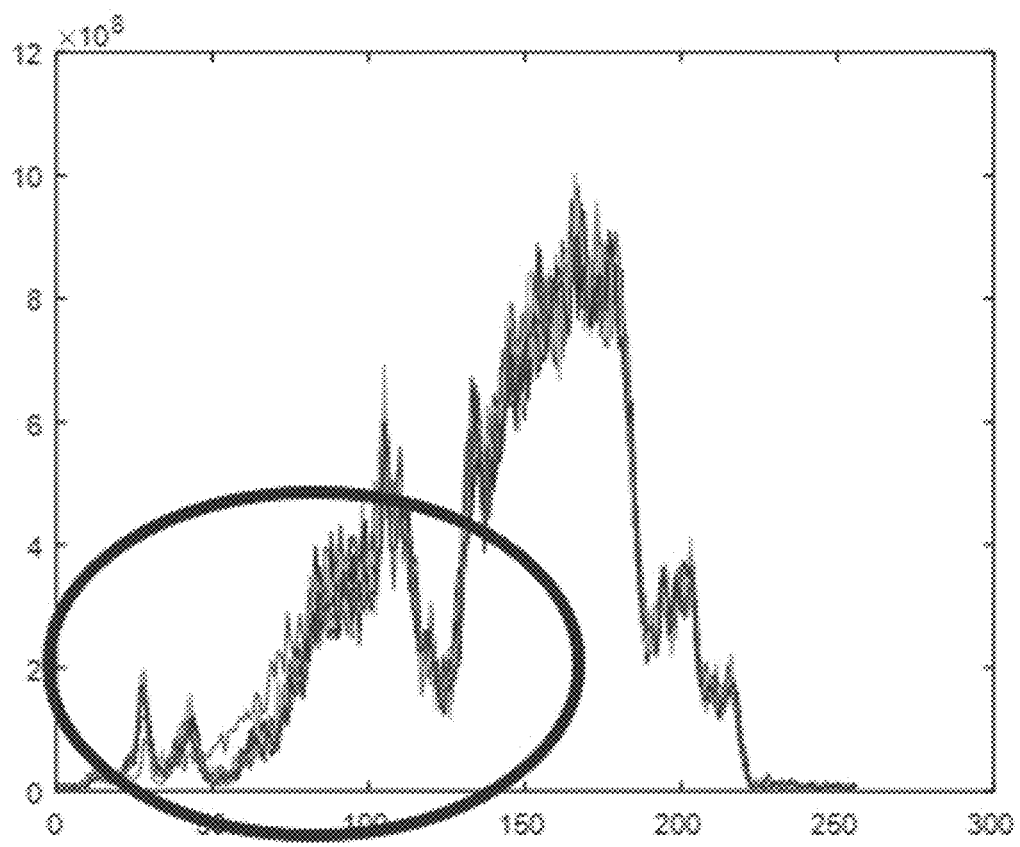
FIG. 19 is a schematic diagram illustrating auxiliary magnetic resonance data according to some embodiments of the present disclosure.

The curve shown in FIG. 19 may be image domain data generated by performing an inverse Fourier transform on the data obtained in the AP direction (i.e., the AP direction data in the motion detection data). The abscissa is a coordinate (0-256) along the AP direction in the image domain, and the ordinate is a signal strength. As shown in FIG. 19, it is divided into two segments along the AP direction, the abscissa 0-128 corresponds to the data in the A direction, and 129-256 corresponds to the data in the P direction. It may be seen that due to the swallowing motion, the data in the A direction has a sub-set of data that is different from other data (a rate of change of the ordinate value of the sub-set of data is much greater than that of other sub-sets of data), and because the data in the P direction is not greatly affected by the swallowing motion, the coincidence degree is relatively good.

In some embodiments, after it is determined that no swallowing motion occurs, the processing device 120 may directly obtain the motion state 1870 based on the auxiliary magnetic resonance data 1810. For example, the motion state information may be obtained through the operation(s) shown in FIG. 5.

In some embodiments of the present disclosure, for the interference caused by the motion of the region of non-interest caused by the motion such as the head swallowing motion, etc. on the motion state of the region of interest, the data in different directions in the auxiliary magnetic resonance data may be calculated in segments to obtain the motion states of different directions for weighting or removing, so as to avoid unnecessary motion state reflection such as the swallowing motion and obtain a more realistic, accurate, and credible motion state.

FIG. 7 is a flowchart illustrating an exemplary process for motion detection in magnetic resonance imaging according to some embodiments of the present disclosure.

In some embodiments, one or more operations of the process 700 shown in FIG. 7 may be implemented by the system 100 shown in FIG. 1. For example, the process 700 shown in FIG. 7 may be stored in a storage medium of the processing device 120 in the form of instructions and called and/or executed by a processing device (e.g., the processing device 120). For the purpose of illustration, the execution of the process 700 is described below by taking the processing device 120 as an example.

As shown in FIG. 7, the process 700 may include one or more of the following operations. In some embodiments, the process 700 may be executed by the processing device 120 or the motion state determination module 220. In some embodiments, the processing device 120 may obtain auxiliary magnetic resonance data in various feasible implementation ways (for example, the processing device 120 may obtain the auxiliary magnetic resonance data in various ways described in the operation 310 in FIG. 3), and the processing device 120 may determine the motion state information of the region of interest of the target object based on the auxiliary magnetic resonance data by executing the operation(s) shown in the process 700 after obtaining the auxiliary magnetic resonance data.

An involuntary motion such as peristalsis of the abdominal or pelvic, heart beats, etc., may often be not controlled by the scanned object and may be common in the scanning process. If the motion state is reflected, it may be prompted frequently that the scanned object moves. In addition, even if the motion state is reflected, it may be difficult to interact with the scanned object and make the scanned object cooperate with the scanning. Therefore, for a case of involuntary motion, it may be necessary to treat the involuntary motion as an unnecessary motion state, avoid the influence, and retain a real motion state.

Because the involuntary motion such as peristalsis and heart beats usually occurs in a non-boundary region, which does not cause the motion in the boundary region, and the voluntary motion (e.g., a breathing motion, a body motion, etc.) is usually reflected in the boundary region, the real motion state may be reflected through the data of the boundary region. In some embodiments, the processing device 120 may obtain the boundary region of the auxiliary magnetic resonance data (or magnetic resonance signal(s)) using a boundary extraction algorithm and calculate the motion state of the scanned object (i.e., the target object). In some embodiments, the boundary region may include tissues such as fat, etc.

In 710, the processing device 120 may determine boundary data in the auxiliary magnetic resonance data.

The boundary data refers to motion detection data belonging to the boundary region, for example, the motion detection data of the fat tissue in the abdomen, the pelvis, the heart, etc. In some embodiments, the processing device 120 may determine the boundary data from obtained auxiliary magnetic resonance data.

Figure 20:
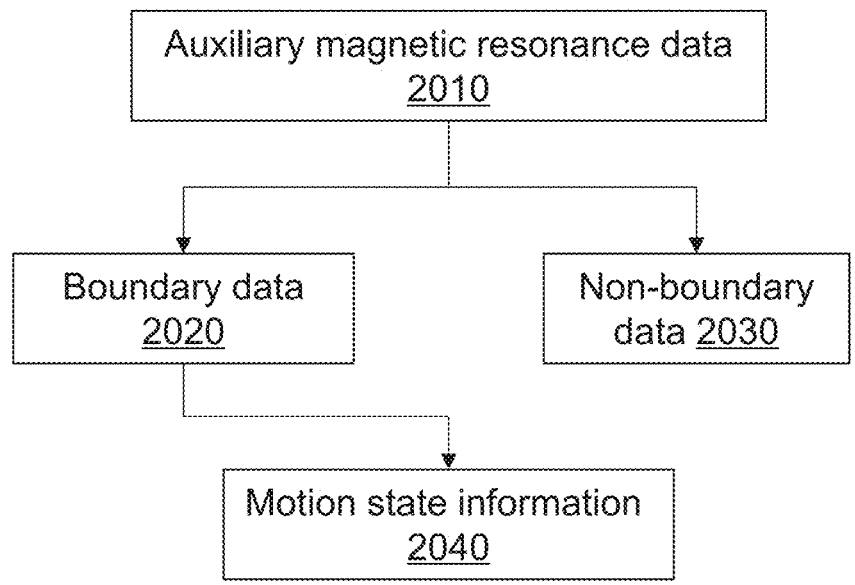
FIG. 20 is a schematic diagram illustrating a process for motion detection in magnetic resonance imaging according to some embodiments of the present disclosure.

In some embodiments, the processing device 120 may obtain a boundary range of the auxiliary magnetic resonance data, that is, a range of data in the boundary region, in various ways (e.g., an edge extraction algorithm, etc.). As shown in FIG. 20, the processing device 120 may obtain the boundary range by extracting boundaries of the auxiliary magnetic resonance data 2010, so as to determine the boundary data.

In some embodiments, the processing device 120 may perform an inverse Fourier transform on the auxiliary magnetic resonance data X to obtain the image domain signal(s) x, search point by point from both sides to a center, find boundary points L1 and R1 between the noise on both sides and the actual signal(s), and perform segmentation processing on the data to obtain two segments (i.e., data XL and XR). For XL and XR, maximum values in the respective regions may be obtained and recorded as MaxL and MaxR, and position points of half-height and width XL(N)=MaxL/2, XR(N)=MaxR/2 may be found from the outside to the inside, which may be recorded as L2, R2, the boundary range may be between (L1, L2) and (R2, R1), and the boundary data may be the data between the ranges (L1, L2) and (R2, R1).

In 720, the processing device 120 may determine the motion state information of the region of interest according to the boundary data.

As shown in FIG. 20, the processing device 120 may obtain boundary data 2020 and non-boundary data 2030 by extracting the boundaries from the auxiliary magnetic resonance data 2010, and determine the motion state information 2040 according to the boundary data 2020 (removing the non-boundary data 2030).

In some embodiments, for the magnetic resonance signal(s) x of the image domain by the inverse Fourier transform performed on the auxiliary magnetic resonance data X, if the boundary data is determined to be data between the ranges (L1, L2) and (R2, R1), the processing device 120 may take the data x(L1, L2) and x(R2, R1) of the ranges (L1, L2) and (R2, R1) for calculating the motion curve. For example, the same boundary extraction processing may be performed on the reference data, and a difference between the boundary data in the target data and the reference data may be determined according to the operation(s) shown in FIG. 5, so as to determine the motion curve.

Figure 21:
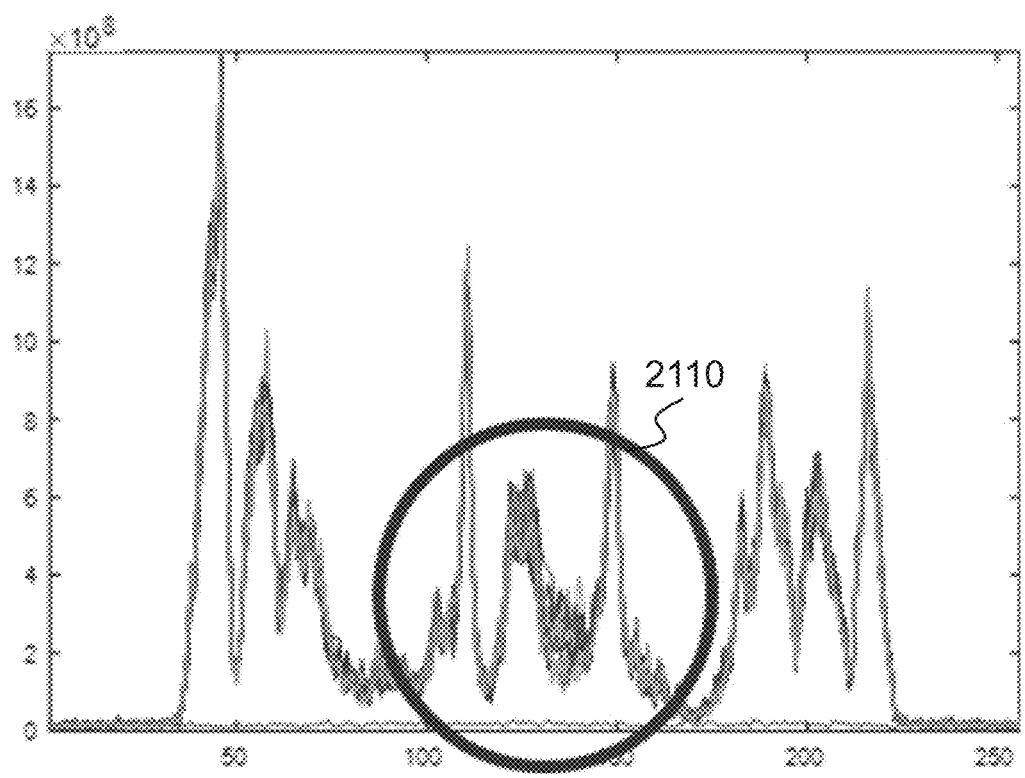
FIG. 21 is a schematic diagram illustrating auxiliary magnetic resonance data according to some embodiments of the present disclosure.

The curve shown in FIG. 21 is the image domain data generated by performing the inverse Fourier transform on the auxiliary magnetic resonance data. The abscissa is a coordinate (0-256) in the image domain, and the ordinate is a signal strength. As shown in FIG. 21, the data in the circled region 2110 represents the non-boundary region data of the auxiliary magnetic resonance data, and the data outside the circled region 2110 represents the boundary region data of the auxiliary magnetic resonance data. Due to the involuntary motion such as peristalsis, etc., the data coincidence degree of the non-boundary region is not high. The data coincidence degree of the boundary region is relatively high because the boundary region is not greatly affected by the involuntary motion.

In some embodiments of the present disclosure, for the involuntary motion (e.g., peristalsis of abdomen or pelvic, heart beats, etc.), the boundary range may be obtained by performing the boundary extraction algorithm on the auxiliary magnetic resonance data, and the motion state may be determined according to the boundary data, thereby avoiding the influence of the involuntary motion such as the peristalsis and obtaining a more actual, accurate, and credible motion state.

It should be noted that the above descriptions about the processes 300, 400, 500, 600, and 700 are merely for the purpose of illustration, and not intended to limit the scope of application of the present disclosure. For those skilled in the art, various modifications and changes may be made to the processes 300, 400, 500, 600, and 700 under the guidance of the present disclosure. However, such modifications and changes are still within the scope of the present disclosure. For example, the order of the operation 510 and operation 520 may be swapped. As another example, the operation 710 may be performed between the operation 530 and the operation 540.

The possible beneficial effects of the embodiments of the present disclosure may include but are not limited to: (1) by inserting the auxiliary sequence for motion detection with the short duration in the imaging sub-sequences and by combining the motion state features of the different parts, obtaining and processing the magnetic resonance signal(s) for motion detection in real time, and removing redundant interference by performing the algorithm processing, a more accurate and reliable real-time motion curve can be obtained, the motion state of the scanned object can be better reflected, and a more accurate reconstruction image can be obtained; (2) by setting different auxiliary sequences for motion detection for different types of imaging sub-sequences, the validity and stability of the echo signals acquired by the auxiliary sequences can be guaranteed; (3) by setting different auxiliary sequence scanning parameters for the different parts of the target object, the accuracy of the detection of the motion state of the target object can be improved; (4) by obtaining the data related to the target features characterizing the motion state of the target object and determining the motion state information of the region of interest based on the data, the processing of the data can be more targeted, thereby improving the robustness of the system and improving the accuracy and stability of motion detection; (5) by processing the acquired signal(s) using the phase filtering algorithm, the phase interference caused by the non-motion factor(s) such as field drift, temperature rise, etc. can be removed, and the accuracy of the data can be improved, so that a more accurate motion state can be obtained; (6) by detecting and removing the influence of the unnecessary motion (e.g., a motion of a part of non-interest such as a head swallowing, etc., an involuntary motion such as peristalsis, etc.) when detecting the motion state through a manner such as segmentation calculation, boundary extraction algorithm, etc., a more precise motion state can be obtained; and (7) the above methods are simple, easy to implement, and have good practicability. Through the comprehensive application of the above means, the availability, reliability, credibility, and accuracy of the motion state can be guaranteed. It should be noted that different embodiments may have different beneficial effects. In different embodiments, the possible beneficial effects may include any combination of one or more of the above, or any other possible beneficial effects that may be obtained.

Having thus described the basic concepts, it may be rather apparent to those skilled in the art after reading this detailed disclosure that the foregoing detailed disclosure is intended to be presented by way of example only and is not limiting. Although not explicitly stated here, those skilled in the art may make various modifications, improvements and amendments to the present disclosure. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various parts of this specification are not necessarily all referring to the same embodiment. In addition, some features, structures, or features in the present disclosure of one or more embodiments may be appropriately combined.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure does not mean that the present disclosure object requires more features than the features mentioned in the claims. Rather, claimed subject matter may lie in less than all features of a single foregoing disclosed embodiment.

In some embodiments, the numbers expressing quantities or properties used to describe and claim certain embodiments of the present disclosure are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the present disclosure disclosed herein are illustrative of the principles of the embodiments of the present disclosure. Other modifications that may be employed may be within the scope of the present disclosure. Thus, by way of example, but not of limitation, alternative configurations of the embodiments of the present disclosure may be utilized in accordance with the teachings herein. Accordingly, embodiments of the present disclosure are not limited to that precisely as shown and described.

What is claimed is:

1. A method implemented on at least one machine each of which has at least one processor and at least one storage device for motion detection in magnetic resonance imaging, comprising:

obtaining auxiliary magnetic resonance data of a target object by scanning the target object using an auxiliary sequence inserted in at least two imaging sub-sequences in a magnetic resonance imaging process of the target object, wherein the auxiliary sequence includes a plurality of auxiliary sub-sequences inserted at different positions in the at least two imaging sub-sequences; and determining, based on the auxiliary magnetic resonance data, motion state information of a region of interest of the target object, including:

determining reference data based on a first sub-set of auxiliary magnetic resonance data obtained using a first auxiliary sub-sequence of the plurality of auxiliary sub-sequences;

determining target data based on a second sub-set of auxiliary magnetic resonance data obtained using a second auxiliary sub-sequence of the plurality of auxiliary sub-sequences;

determining a difference between the reference data and the target data; and determining the motion state information of the region of interest according to the difference.

2. A system for motion detection in magnetic resonance imaging, comprising:

at least one storage device storing a set of instructions; and at least one processor in communication with the storage device, wherein when executing the set of instructions, the at least one processor is configured to cause the system to perform operations including:

obtaining auxiliary magnetic resonance data of a target object by scanning the target object using an auxiliary sequence inserted in at least two imaging sub-sequences in a magnetic resonance imaging process of the target object, wherein the auxiliary sequence includes a plurality of auxiliary sub-sequences inserted at different positions in the at least two imaging sub-sequences; and determining, based on the auxiliary magnetic resonance data, motion state information of a region of interest of the target object, including:
  determining reference data based on a first sub-set of auxiliary magnetic resonance data obtained using a first auxiliary sub-sequence of the plurality of auxiliary sub-sequences;
  determining target data based on a second sub-set of auxiliary magnetic resonance data obtained using a second auxiliary sub-sequence of the plurality of auxiliary sub-sequences;
  determining a difference between the reference data and the target data; and
  determining the motion state information of the region of interest according to the difference.

3. A method implemented on at least one machine each of which has at least one processor and at least one storage device for magnetic resonance imaging, comprising:
  obtaining auxiliary magnetic resonance data of a target object by scanning the target object using an auxiliary sequence inserted in at least two imaging sub-sequences in a magnetic resonance imaging process of the target object, wherein the auxiliary sequence includes a plurality of auxiliary sub-sequences inserted at different positions in the at least two imaging sub-sequences;
  determining, based on the auxiliary magnetic resonance data, motion state information of a region of interest of the target object, including:
    determining reference data based on a first sub-set of auxiliary magnetic resonance data obtained using a first auxiliary sub-sequence of the plurality of auxiliary sub-sequences;
    determining target data based on a second sub-set of auxiliary magnetic resonance data obtained using a second auxiliary sub-sequence of the plurality of auxiliary sub-sequences;
    determining a difference between the reference data and the target data; and
    determining the motion state information of the region of interest according to the difference; and
  obtaining magnetic resonance imaging data of the region of interest of the target object by controlling, based on the motion state information of the region of interest, an imaging scan related to the at least two imaging sub-sequences performed on the target object.

4. The method of claim 1, further comprising:
determining a target correlation parameter of the auxiliary sequence based on a first correlation parameter of the at least two imaging sub-sequences, wherein
the target correlation parameter includes at least one of a count of auxiliary sub-sequences included in the auxiliary sequence, a pulse excitation angle, or an insertion density of the auxiliary sequence in the at least two imaging sub-sequences, and
the first correlation parameter includes a sequence type of the at least two imaging sub-sequences.

5. The method of claim 1, wherein the obtaining auxiliary magnetic resonance data of a target object by scanning the target object using an auxiliary sequence inserted in at least two imaging sub-sequences comprises:
  obtaining, based on one or more target readout directions, the auxiliary magnetic resonance data by exciting one or more target slices in scanning the target object using the auxiliary sequence, wherein the one or more target readout directions correspond to the one or more target slices respectively.

6. The method of claim 1, wherein the determining, based on the auxiliary magnetic resonance data, motion state information of a region of interest of the target object comprises:
  obtaining, in the auxiliary magnetic resonance data, partial data related to a target feature; and
  determining the motion state information of the region of interest based on the partial data.

7. The method of claim 1, further comprising:
performing a phase filtering processing on the auxiliary magnetic resonance data.

8. The method of claim 1, wherein the determining, based on the auxiliary magnetic resonance data, motion state information of a region of interest of the target object comprises:
  obtaining, in the auxiliary magnetic resonance data, first data related to a first direction of the region of interest and second data related to a second direction of the region of interest, wherein an influence of an interfering motion in the first direction is stronger than an influence of the interfering motion in the second direction; and
  determining the motion state information of the region of interest according to the first data and the second data.

9. The method of claim 1, wherein the determining, based on the auxiliary magnetic resonance data, motion state information of a region of interest of the target object comprises:
  determining boundary data in the auxiliary magnetic resonance data; and
  determining the motion state information of the region of interest according to the boundary data.

10. The system of claim 2, wherein the obtaining auxiliary magnetic resonance data of a target object by scanning the target object using an auxiliary sequence inserted in at least two imaging sub-sequences comprises:
  obtaining, based on one or more target readout directions, the auxiliary magnetic resonance data by exciting one or more target slices in scanning the target object using the auxiliary sequence, wherein the one or more target readout directions correspond to the one or more target slices respectively.

11. The system of claim 2, wherein the determining, based on the auxiliary magnetic resonance data, motion state information of a region of interest of the target object comprises:
  obtaining, in the auxiliary magnetic resonance data, partial data related to a target feature; and
  determining the motion state information of the region of interest based on the partial data.

12. The method of claim 5, wherein at least one of the one or more target slices or the one or more target readout directions is determined based on a second correlation parameter of the at least two imaging sub-sequences.

13. The method of claim 5, wherein at least one of the one or more target slices or the one or more target readout directions is determined based on a spatial distribution of an imaging part of the target object.

14. The method of claim 5, wherein at least one of the one or more target slices or the one or more target readout directions is determined based on a position of the region of interest.

15. The method of claim 5, wherein the determining, based on the auxiliary magnetic resonance data, motion state information of a region of interest of the target object comprises:
- obtaining processed magnetic resonance data by preprocessing, based on the one or more target readout directions, the auxiliary magnetic resonance data; and
- determining, based on the processed magnetic resonance data, the motion state information of the region of interest.

16. The method of claim 8, wherein the determining the motion state information of the region of interest according to the first data and the second data comprises:
- dividing the first data into at least two first segments along the first direction;
- determining a first motion state of each of the at least two first segments;
- dividing the second data into at least two second segments along the second direction;
- determining a second motion state of each of the at least two second segments;
- determining a first difference between first motion states of the at least two first segments;
- determining a second difference between second motion states of the at least two second segments; and
- determining whether the auxiliary magnetic resonance data is affected by the interfering motion according to the first difference and the second difference.

17. The method of claim 12, wherein the second correlation parameter includes at least one excitation slice and at least one readout direction in scanning the target object using the at least two imaging sub-sequences.

18. The method of claim 16, wherein the determining the motion state information of the region of interest according to the first data and the second data further comprises:
- in response to determining that the auxiliary magnetic resonance data is affected by the interfering motion,
- setting a first weight of the first data and a second weight of the second data, the first weight being smaller than the second weight; and
- determining the motion state information of the region of interest according to the first weight and the second weight.

19. The method of claim 16, wherein the determining the motion state information of the region of interest according to the first data and the second data further comprises:
- in response to determining that the auxiliary magnetic resonance data is affected by the interfering motion,
- determining the motion state information of the region of interest according to the second data.

* * * * *